United States Patent
Yamazaki et al.

(10) Patent No.: US 7,648,897 B2
(45) Date of Patent: Jan. 19, 2010

(54) METHOD FOR MANUFACTURING CONDUCTIVE LAYER AND SEMICONDUCTOR DEVICE

(75) Inventors: Shunpei Yamazaki, Tokyo (JP); Yasuko Watanabe, Kanagawa (JP); Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 348 days.

(21) Appl. No.: 11/650,693

(22) Filed: Jan. 8, 2007

(65) Prior Publication Data

US 2007/0122950 A1 May 31, 2007

Related U.S. Application Data

(63) Continuation of application No. 10/757,167, filed on Jan. 13, 2004, now Pat. No. 7,183,146.

(30) Foreign Application Priority Data

Jan. 17, 2003 (JP) .............................. 2003-009106

(51) Int. Cl.
*H01L 21/4763* (2006.01)
(52) U.S. Cl. .................... 438/585; 438/151; 438/587; 257/E21.174
(58) Field of Classification Search ................ 438/151, 438/164, 166, 478, 479, 585, 587; 257/E21.174
See application file for complete search history.

(56) References Cited

U.S. PATENT DOCUMENTS

| | | | |
|---|---|---|---|
| 5,132,248 A | | 7/1992 | Drummond et al. |
| 6,008,078 A | * | 12/1999 | Zhang .......................... 438/164 |
| 6,010,923 A | * | 1/2000 | Jinno ........................... 438/158 |
| 6,200,508 B1 | * | 3/2001 | Jacobson et al. ............. 264/104 |
| 6,294,401 B1 | | 9/2001 | Jacobson et al. |
| 6,362,507 B1 | | 3/2002 | Ogawa et al. |
| 6,514,801 B1 | | 2/2003 | Yudasaka et al. |
| 6,713,389 B2 | | 3/2004 | Speakman |
| 6,794,220 B2 | | 9/2004 | Hirai et al. |
| 6,803,262 B2 | * | 10/2004 | Wu et al. ...................... 438/149 |
| 6,838,361 B2 | * | 1/2005 | Takeo ........................... 438/493 |
| 2002/0070382 A1 | | 6/2002 | Yamazaki et al. |
| 2003/0054653 A1 | | 3/2003 | Yamazaki et al. |
| 2003/0059987 A1 | | 3/2003 | Sirringhaus et al. |
| 2004/0147066 A1 | | 7/2004 | Yamazaki et al. |
| 2004/0253835 A1 | | 12/2004 | Kawase |

FOREIGN PATENT DOCUMENTS

JP 05-338187 12/1993

(Continued)

*Primary Examiner*—Zandra Smith
*Assistant Examiner*—Christy L Novacek
(74) *Attorney, Agent, or Firm*—Cook Alex Ltd.

(57) ABSTRACT

To provide a method for manufacturing a wiring, a conductive layer, a display device, and a semiconductor device, each of which can meet a large sized substrate and which is manufactured with a higher throughput by using a material efficiently, the conductive layer is formed over the substrate having an insulating surface by discharging the conductive material, and heat treatment is performed by a lamp or a laser beam over the conductive layer. Furthermore, the conductive film is formed under reduced pressure according to the present invention.

34 Claims, 17 Drawing Sheets

FOREIGN PATENT DOCUMENTS

| | | |
|---|---|---|
| JP | 06-182980 | 7/1994 |
| JP | 06-237063 | 8/1994 |
| JP | 10-270843 | 10/1998 |
| JP | 2001-052864 | 2/2001 |
| JP | 2002-324966 | 11/2002 |
| JP | 2002-359246 | 12/2002 |

* cited by examiner

DRIVING CIRCUIT PORTION A ⟷ PIXEL PORTION B          LIGHT C

DRIVING TFT107

DRIVING TFT107

FIG. 11A
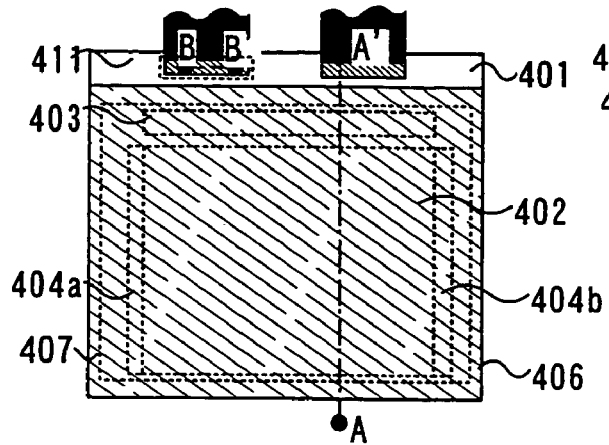
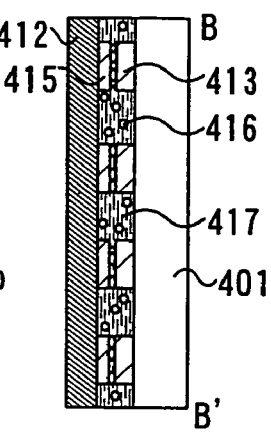
FIG. 11B
FIG. 11C
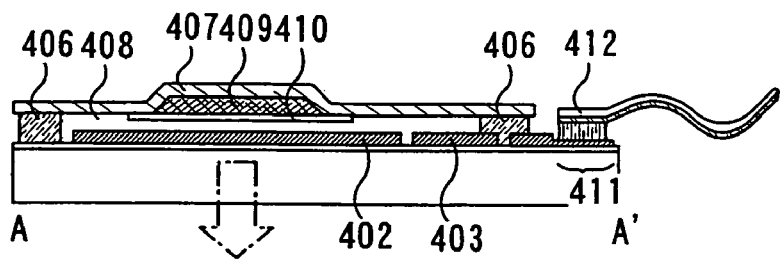
FIG. 11D
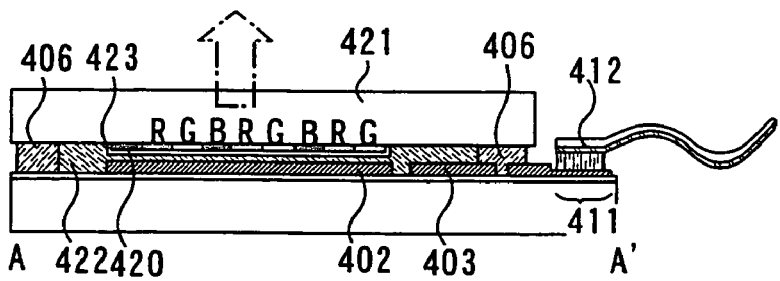
FIG. 11E
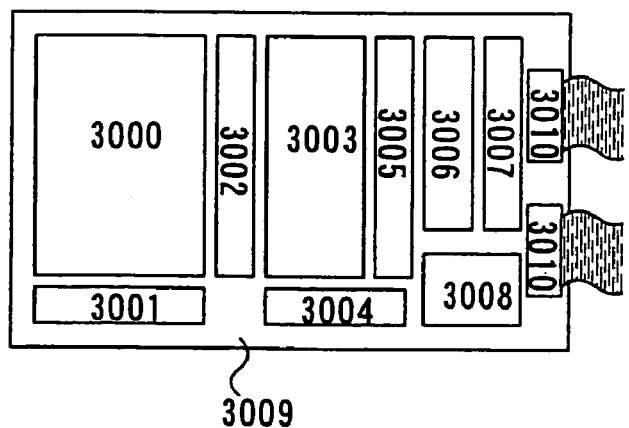

METHOD FOR MANUFACTURING CONDUCTIVE LAYER AND SEMICONDUCTOR DEVICE

This application is a continuation of U.S. application Ser. No. 10/757,167, filed on Jan. 13, 2004 now U.S. Pat. No. 7,183,146.

BACKGROUND OF THE INVENTION

1. Field of the Invention

The present invention relates to a method for manufacturing a wiring, a conductive layer and a display device, more particularly, the present invention relates to a method for manufacturing a wiring, a conductive layer, and a display device by using ink-jet.

Further, the present invention is related to a method for manufacturing a wiring, a conductive layer, a display device, and a semiconductor device by using a method of discharging a conductive material.

2. Description of the Related Art

A thin film transistor (hereinafter referred to as a TFT) formed by using a thin film of an insulating surface is widely applied to an integrated circuit and the like, and is often used as a switching element. Particularly, a display panel using the TFT has been widely used for a large sized display device, therefore, high definition, high aperture ratio, high reliability and a larger screen are increasingly required.

As a method for manufacturing a wiring in a thin film transistor, a method in which a coat of conductive layer is formed over the whole surface of the substrate and the etching treatment is performed using a mask can be noted. (Refer to Japanese unexamined patent publication No. 2002-359246)

In the case of forming a wiring as described in the above reference, for example an ICP etching system, there is a case where the selected ratio of a resist and a conductive layer vary in accordance with etching conditions such as a bias power density, an ICP power density, a pressure, a total flow ratio of etching gas, an additive ratio of oxygen, and a temperature of a lower part electrode, and variation in width or length of the conductive layer in a substrate is occurred. In addition, in the case of performing the etching treatment, a throughput is degraded since a step of manufacturing a mask is required. Further, some materials are wasted since the etching treatment is performed in order to make a desired shape after forming the conductive layer over the whole surface. These problems become more serious when a wiring is formed over the large sized substrate having a side of over one meter long.

SUMMARY OF THE INVENTION

The present invention is offered in view of the above problems, and it is an object of the present invention to provide a method for manufacturing a wiring, a conductive layer, a display device and a semiconductor device each of which can corresponds to a large sized substrate. A further object of the present invention is to provide a method for manufacturing a wiring, a conductive layer, a display device, and a semiconductor device in which a throughput and efficiency in the use of a material are enhanced.

In order to solve the problems of the related art, the following steps are taken in the present invention.

According to the present invention, a conductive layer is manufactured over a substrate having an insulating surface by ink-jet, namely, by discharging a conductive material under reduced pressure; heat treatment is performed over the substrate in which the conductive layer is manufactured under reduced pressure.

According to the present invention, a conductive layer is formed over the insulating surface by discharging a composition including a conductive material from an ink head. A gate electrode, a source wiring, a drain wiring, a pixel electrode, a counter electrode, and the like can be noted as the conductive layer. Such a conductive layer can be manufactured according to the present invention.

According to the present invention, a wiring is formed over the substrate having an insulating surface by discharging a composition including a conductive material from an ink head under reduced pressure; after first heat treatment or the irradiation of ultraviolet rays is performed over the substrate provided with the insulating surface, press treatment is performed on the wiring, and the second heat treatment is performed over the pressed wiring.

The heat treatment and the irradiation of ultraviolet rays are performed for the purpose of obtaining the desired viscosity of the composition discharged from the ink head. A lamp annealing apparatus for rapidly and directly heating the substrate using a lamp such as halogen lamp for a heat source or a laser irradiation apparatus for applying a laser beam irradiation are used for the heat treatment. Both of the apparatuses can perform the heat treatment only on the desired area by scanning the heat source respectively. Therefore, the heat treatment can be selectively performed only on the region in which the conductive layer is formed. An annealing furnace which is set at predetermined temperature, an oven which is set at 100° C. to 300° C. and the like can be used as the other method.

Further, the heat treatment and the irradiation of ultraviolet rays are performed for the purpose of drying and solidifying the composition discharged from the ink head. Specifically, a solvent which composes a compound material is volatilized and solidified. When the composition is composed of metal grains such as silver and gold, the composition is baked after the step of drying, and solidified by combining the metal grains. However the both of the drying and the baking are included in the step of heat treatment, the purpose, the temperature of the heat treatment, and the time for the heat treatment are different, respectively.

According to the present invention, a first conductive layer is formed over the semiconductor substrate formed over the substrate having an insulating surface by ink-jet, namely by discharging a conductive material under reduced pressure; the second conductive layer is formed over the insulating film which is formed on the first conductive layer which has a contact hole connected with the semiconductor, so as to fill the contact hole by ink-jet, namely discharging the conductive material under reduced pressure; heat treatment is performed over the substrate in which the first and the second conductive layers are formed; a pixel electrode, an electroluminescent layer; and a counter electrode are successively formed by ink-jet, namely discharging the conductive material over the second conductive layer under reduced pressure; and the second heat treatment is performed over the substrate in which the pixel electrode, the electroluminescent layer, and the counter electrode are formed.

As described above, according to the present invention in which a conductive layer is formed by ink-jet, namely by discharging the conductive material, for example, the pixel electrode, the electroluminescent layer, the counter electrode can be successively formed without being exposed to the air by changing the composition discharged from an ink head or changing the ink head filled with the composition.

The ink-jet is to keep the relative distance between a nozzle and an object to be processed, move the either of the nozzle or the object to be processed, and then discharge the composition from the nozzle in order to form a thin film formed of the composition over the object to be processed. Therefore, the inkjet includes the other methods such as dispenser method.

The invention in which the conductive layer is formed by ink-jet, namely, by discharging the conductive material has advantages of being excellent at uniformity of the film thickness and the like compared with a screen printing system in which a thin film (typically, an electroluminescent layer) is formed by applying a solution using a printing roll or a relief printing in which a pattern to be printed is engraved, and baking.

According to the present invention, the treatment is performed under reducer pressure. As used here in, the term "under reduced pressure" refers to under the pressure which is reduced so as to be lower than the atmospheric pressure. And it may set at from $1 \times 10^2$ to $2 \times 10^4$ Pa (preferably, from $5 \times 10^2$ to $5 \times 10^3$ Pa), and further reduced pressure, it may set at from 1 to $5 \times 10^4$ Pa (preferably, form $1 \times 10^2$ to $1 \times 10^3$ Pa) when the atmosphere is filled with nitrogen, rare gas, or other inert gas. By setting under reduced pressure, the volume of the solvent is reduced with constantly volatilizing the solvent from a droplet until the droplet arrives to the thin film over the substrate. Therefore, the subsequent heat treatment can be carried out in a shorter time. Further, the steps of the subsequent heat treatment can be omitted.

The present invention may be utilized for the purpose of repairing the faulty point of electric connection between the wiring and the electrode, and the like. In that case, it becomes possible to input the repairing point to a personal computer, for example, and discharge a compound including a conductive material from an ink head toward the repairing point.

According to the present invention having the above-described constitution, a wiring and a conductive layer can be easily formed over the large sized substrate having a side of over one meter long. Since only the quantity needed of the material is discharged, and the small amount of the wasted material is left, the efficiency in the use of a material can be enhanced and manufacturing cost can be reduced.

In addition, the steps of exposure and development can be significantly reduced since the mask is unnecessary. Plural thin films of such as an electroluminescent layer of a light emitting element and an electrode can be successively formed by changing a composition discharged form an ink head or changing an ink head filled with the composition. As a result, a throughput is increased and productivity can be enhanced. Since a mask for the exposure becomes unnecessary, a circuit wiring inputted into a personal computer and the like can be rapidly manufactured.

According to the present invention in which the conductive layer is formed under reduced pressure, the generation of the dust added to a resist pattern and the reforming of the surface in which the surface of the object to be processed is oxidized can be prevented. Further, a throughput can be enhanced since heat treatment can be selectively performed only over the region in which the conductive layer is formed according to the present invention in which the heat treatment is performed by a laser or a lamp.

These and other objects, features and advantages of the present invention will become more apparent upon reading of the following detailed description along with the accompanied drawings

BRIEF DESCRIPTION OF THE DRAWINGS

FIGS. 11A to 11E are diagrams showing a display panel;

DETAILED DESCRIPTION OF THE PREFERRED EMBODIMENTS

Embodiment Mode 1

The embodiment mode of the present invention is described in detail with reference to FIGS. 1 to 4. However, as is easily known to those skilled in the art, the mode and the detail of the present invention are not limited to the following description and can be variously changed without departing from the purpose and the range of the present invention. Therefore, the present invention is not interpreted while limiting to the following description of the embodiment mode. The same symbol is used to the one which indicates the same among the different drawings in the composition of the present invention described below. Here, manufacturing steps of forming an n-channel type TFT (for switching) and forming two p-channel type TFTs (for driving) over the same substrate by using the present invention are described.

Figure 2A:
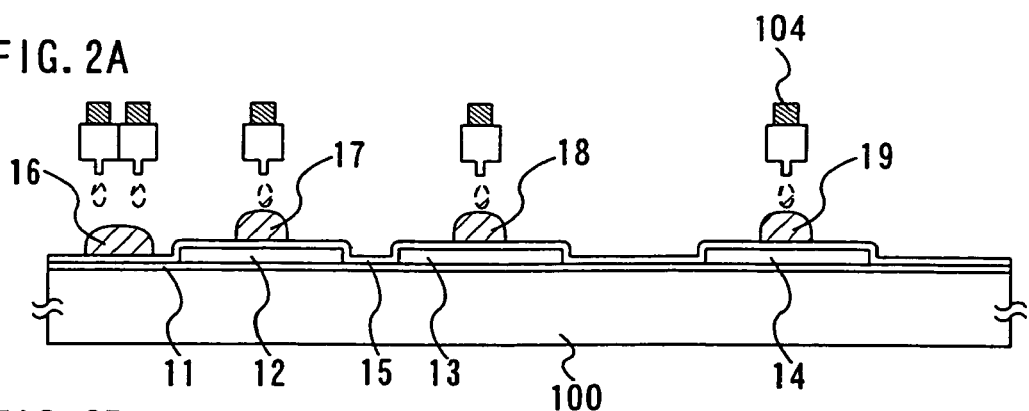
FIGS. 2A to 2E are cross sectional views explaining a manufacturing method of the present invention.
Figure 2B:
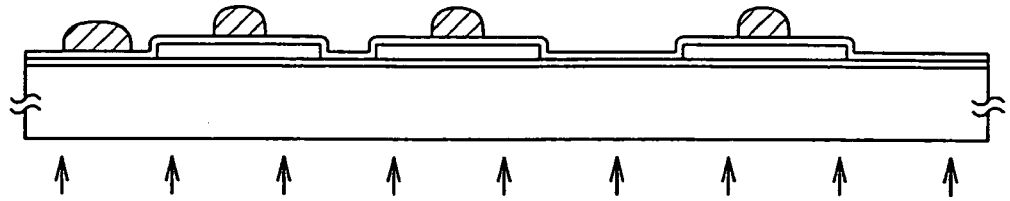

A flexible substrate typified by a glass substrate and a plastic substrate and the like each of which can withstands the processing temperature of the steps is used for a substrate 100 (FIG. 2A). In the embodiment mode, a glass substrate 100 is used. A base film 11 made of an insulating film is formed. The base film 11 may be either of a single layer or laminated layers. In the embodiment mode, the base film 11 is to be a two-layer structure. A silicon nitride-oxide film with the film thickness of 50 nm is formed for a first layer and a silicon oxynitride film with the film thickness of 50 nm is formed for the second layer by sputtering for the base film 11. Then the surface is flattened by CMP, or the like.

Subsequently, semiconductor layers 12 to 14 are formed on the base film 11. As to the semiconductor layers 12 to 14, a semiconductor film is formed with a thickness of 25 to 80 nm by known methods (sputtering, LPCVD, plasma CVD, or the like). Then, the semiconductor film is crystallized by a known crystallization method (laser crystallization, thermal crystallization using RTA or annealing furnace, thermal crystallization using a metal element that promotes crystallization, or the like). Then, the obtained crystalline semiconductor film is patterned into a desired shape to form the semiconductor layers 12 to 14. Note that an amorphous semiconductor film, a microcrystalline semiconductor film, a crystalline semiconductor film, a compound semiconductor film with an amorphous structure such as an amorphous silicon germanium film, or the like may be used as the semiconductor film.

In this embodiment, a 50-nm-thick amorphous silicon film is formed by using plasma CVD. Then, a solution containing nickel is applied over the amorphous silicon film, dehydrogenation (500° C. for 1 hour) is performed to the amorphous silicon film, and then, thermal crystallization (550° C. 4 hours) is conducted thereto, thereby forming a crystalline silicon film. Thereafter, the semiconductor layers 12 to 14 are formed by patterning using a photolithography process.

Note that a continuous wave oscillation or pulsed oscillation type gas laser or solid laser may be used as a laser used in the case where the crystalline semiconductor film is formed by laser crystallization. As the former gas laser, an excimer laser, a YAG laser or the like is used. Also, as the latter solid laser, a laser which uses crystals such as YAG, $YVO_4$, or the like which is doped with Cr, Nd, or the like is used. Note that, in crystallization of the amorphous semiconductor film, it is preferable that the solid laser capable of conducting continuous wave oscillation be used and that the oscillation of the second harmonic wave to the fourth harmonic wave with respect to the fundamental wave be applied in order to obtain crystals with a large grain size. In the case of using the above lasers, the laser beam emitted from a laser oscillator is condensed in a linear shape by an optical system, and the semiconductor film is preferably irradiated with the laser beam.

However, in the embodiment mode, since the crystallization of the amorphous silicon film is conducted by using a metal element that promotes crystallization, the metal element remains in the crystalline silicon film. Therefore, an amorphous silicon film with a thickness of 50 to 100 nm is formed over the crystalline silicon film, and heat treatment (thermal annealing using RTA or furnace annealing, or the like) is performed thereto to diffuse the metal element into the amorphous silicon film. After the heat treatment, the amorphous silicon film is removed by conducting etching. As a result, the metal element in the crystalline silicon film can be reduced or removed. After forming the semiconductor layers 12 to 14, a minute amount of impurity elements (boron or phosphorus) may be doped (channel doping) in order to control the threshold value of a TFT.

Subsequently, a gate insulating film 15 which covers the semiconductor layers 12 to 14 is formed. The gate insulating film 15 is formed of an insulating film containing silicon to have a thickness of 40 to 150 nm by using plasma CVD or sputtering. In the embodiment mode, as the gate insulating film 15, a silicon oxynitride film is formed with a thickness of 115 nm by plasma CVD.

Then, the first conductive layers (a gate wiring, and a gate electrode) 16 to 19 are formed under reduced pressure by ink-jet. The perspective view is shown in FIG. 1.

Figure 1:
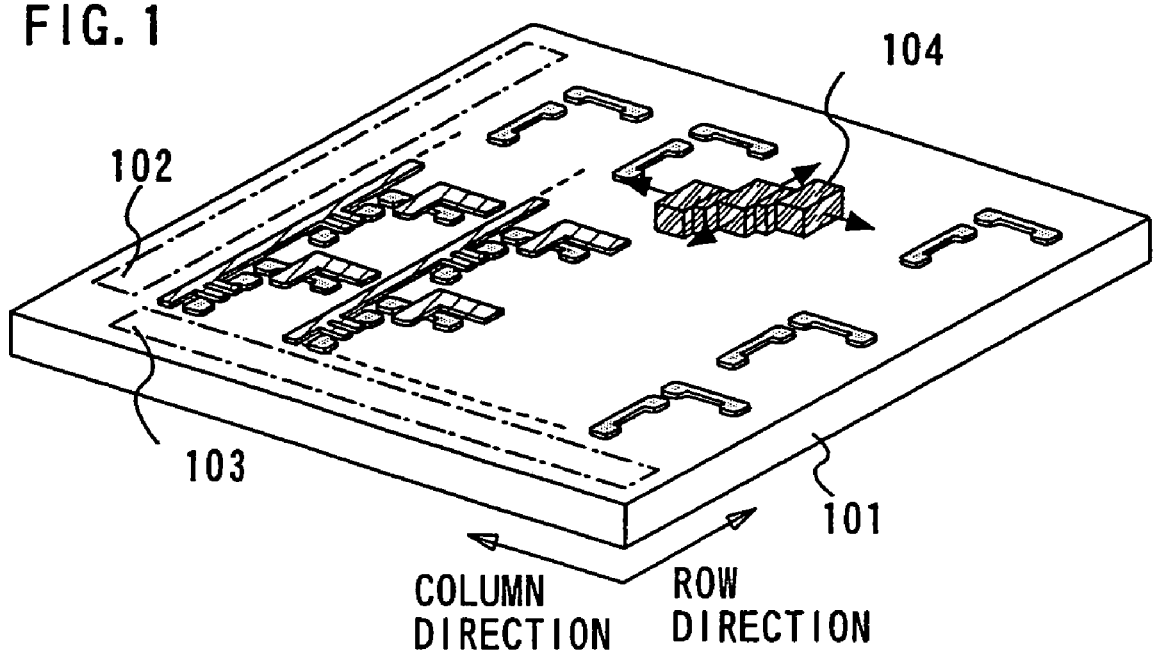
FIG. 1 is a perspective view explaining a manufacturing method of the present invention.

In FIG. 1, 101 denotes a substrate, 102 denotes a horizontal scanning driver circuit, 103 denotes a vertical scanning driver circuit, and 104 denotes an ink head. The solution is discharged by using the one or plural ink head 104, and scanning the ink head 104 side to side and up and down and parallel to the surface of the substrate 101. According to this constitution, a wiring can be formed only in the desired area.

In FIG. 1, an ink head having three nozzles is shown; however, an ink head having one nozzle may be used. Further, plural ink heads having various nozzle diameters may be prepared and appropriately used according to the usage. The normal nozzle diameter of the ink head is 50 to 100 µm (in wider range, 0.01 to 100 µm); depending on the nozzle diameter, the plural nozzles may be arranged in parallel for having the same length as the side of the substrate so that a wiring can be formed by scanning the ink head once in consideration of the throughput. Further, the optional number of nozzles may be arranged and plural scanning may be performed, or the same spots may be scanned plural times to be recoated. Furthermore, the ink head 104 is preferably to be scanned, however, the substrate 101 may be moved instead. The distance between the substrate 101 and the ink head 104 is preferably set closer, specifically and preferably, approximately 0.1 mm to 2 mm in order to drop into the desired area.

The amount of the composition discharged at a time from the ink head is preferably 10 pl to 70 pl (in wider range, 0.001 to 100 pl), the viscosity is preferably at most 100 cp, and the grain size is preferably at most 0.1 µm (in wider range, at most 1 µm). This will prevent the occurrence of the dryness. The viscosity of the composition, the surface tensity, and the drying rate are properly adjusted in accordance with the solvent to be used and the purpose. The composition discharged from the ink head is preferably formed in a linear shape by subsequently dropping the composition on the substrate. However, the composition may be dropped onto the predetermined spots, per dot, for example.

As the composition discharged from an ink head, the one in which conductive materials properly chosen from an element selected from tantalum (Ta), tungsten (W), titanium (Ti), molybdenum (Mo), aluminum (Al), copper (Cu), chromium (Cr), niobium (Nb), or an alloy material or compound material mainly composed of the foregoing elements are dissolved and dispersed in a solvent can be used. As the solvent, ester such as butyl acetate, or ethyl acetate, spirits such as isopropyl alcohol, or ethyl alcohol, or organic solvent such as methyl ethyl ketone, or acetone is used. The concentration of the solvent is properly decided according to the variety of the conductive materials.

Ultra fine particles (nanometal grains) in which silver (Ag), gold (Au), or platinum (Pt) are dispersed with a grain size of at most 10 nm respectively may be used for the composition discharged form the ink head. The problem of the nozzle blocking may be solved by using the composition in which fine grains are dispersed or dissolved in the solvent. The grain size of the constituent material of the composition is required to be smaller than the grain size of the nozzle in the present invention using ink-jet. Further, a conductive polymer such as polyethylene dioxythiophene/polystyrenesulfonic acid (PEDT/PSS) solution may be used instead.

The wiring resistance can be lower when copper is used as a wiring material; thus, the wiring material using copper is preferably used when a large sized substrate is used. However, in this case, a conductive film which can hinder diffusion of the copper as a barrier is preferably provided so as not to have an adverse affect on the electric characteristic of the transistor. A wiring can be formed on the semiconductor included in a transistor without diffusing copper according to the conductive film which serves as a barrier. As the conductive film which serves as a barrier, one kind of or plural kinds of laminated films selected from tantalum nitride (TaN), titanium nitride (TiN), or tungsten nitride (WN) can be used. An oxidant inhibitor is preferably used at the same time since copper is easily oxidized.

Thereafter, the solvent is volatilized to obtain the desired viscosity of the composition by performing heat treatment over the substrate on which the first conductive layer is formed within the range of 150° C. to 300° C. and under reduced pressure. (FIG. 2B) The solvent in the composition discharged form the ink head 104 is preferably the one which volatilizes after dropping the composition on the substrate. When the solvent having higher volatility such as toluene is used, the solvent is volatilized after dropping the composition on the substrate. In that case, the step of the heat treatment may be omitted. However, the solvent of the composition is not particularly limited, and in the case of using the solvent which volatilizes after the dropping, the composition may be set to the desired viscosity by performing heat treatment. The heat treatment may be performed every time a thin film is formed by ink-jet or every optional step, or after finishing the whole steps As the heat treatment, a lamp annealing apparatus in which the substrate is directly and rapidly heated by using a lamp such as a halogen lamp for a heat source or a laser irradiation apparatus in which the substrate is irradiated with a laser beam is used. In the apparatus, heat treatment can be performed only on the desired area by scanning the heat source itself in the both apparatuses. As the other methods, an annealing furnace which is set at predetermined temperature may be used. When a lamp is used, light having a wave length which dose not destroy the composition of the thin film to be heat-treated and which is capable of only heating, for example, light having a longer wavelength than 400 nm, namely light having the longer wavelength than that of the infrared light is preferably used. In consideration of the handling, a far-infrared ray (the typical wavelength is 4 to 25 μm) is preferably used. When a laser beam is used, the beam spot of the laser beam on the substrate emitted from the laser oscillator preferably have a linear shape so as to be the same length as the length of the row or column of the substrate. And the laser irradiation can be finished by scanning once. In the embodiment mode, the substrate is irradiated with a laser beam having a beam spot of a linear shape as the heat treatment.

Subsequently, an impurity element having a conductive type of n-type or p-type is doped in the semiconductor layers 12 to 15 using the gate electrodes 17 to 19 as a mask. In the embodiment mode, n-type impurities are doped in the semiconductor layers 12 and 13, and p-type impurities are doped in the semiconductor layer 14, thereby forming impurity regions 31 to 33. At the same time, regions 34 to 36 which are not doped with any impurity elements or doped with a small amount of impurity elements (which is generically named as channel formation region) are formed.

Figure 2C:
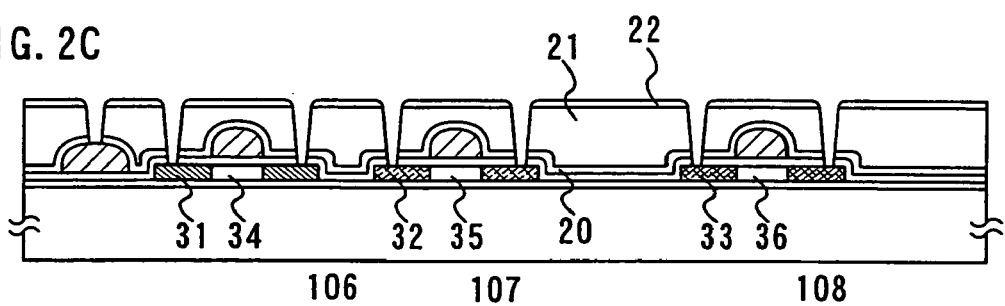

Then, a first interlayer insulating film 20 is formed (FIG. 2C). As the first interlayer insulating film 20, an insulating film including silicon is formed to have a thickness of 100 nm to 200 nm by plasma CVD or sputtering. In the embodiment mode, a silicon oxynitride film 231 with a thickness of 100 nm is formed by plasma CVD.

Then, the second interlayer insulating film 21 is formed over the first interlayer insulating film 20. The second interlayer insulating film 21 is formed of a silicon oxide film formed by CVD, a silicon oxide film formed by SOG (Spin On Glass) or spin coating, or an organic insulating film such as an acrylic film or a nonphotosensitive organic insulating film is used to have a thickness of 0.7 μm to 5 μm. In this embodiment mode, an acrylic film is formed to have a thickness of 1.6 μm by CVD. The second interlayer insulating film 21 reduces and flattens unevenness due to a TFT formed over the substrate 101; therefore, a flat film is preferably used.

Next, the third interlayer insulating film 22 is formed over the second interlayer insulating film 21. The third interlayer insulating film 22 is formed of a silicon nitride film or a silicon oxynitride film with a thickness of 0.1 to 0.2 μm by sputtering. In the embodiment mode, a silicon nitride film is formed to have a thickness of 0.1 μm by sputtering. A blocking function for blocking the penetration of various ionic impurities, oxygen or moisture in the air can be obtained by providing the first to third interlayer insulating films 20 to 22.

A contact hole is provided by dry etching or wet etching. In this embodiment mode, contact holes which reach to impurity regions 31 to 33 respectively are formed by dry etching of the first to the third interlayer insulating films 20 to 22.

Figure 2D:
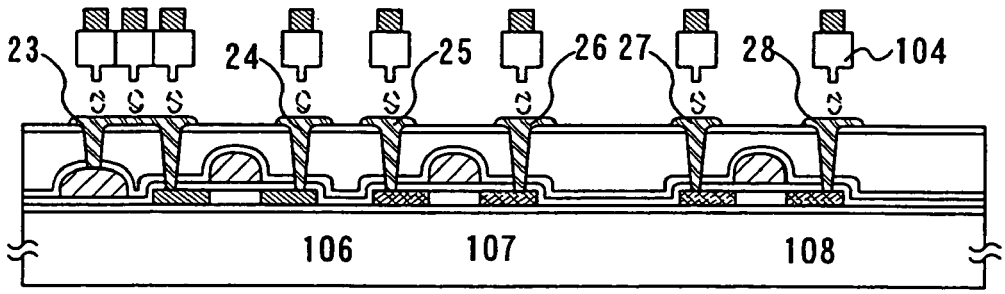

Then, second conductive layers (source and drain wirings) 23 to 28 are formed under reduced pressure by ink-jet. FIG. 2D shows a cross-sectional view at this point.

The composition discharged from the ink head is formed of a single layer structure or a laminated structure by using the one in which a material having conductivity is dissolved or dispersed in a solvent. In the case of forming the second conductive layer, the viscosity of the discharged composition is required to be set to the optimum level so that the contact hole is fully filled with the discharged composition. In order to fully filling the contact holes, the ink head 104 may be scanned plural times for recoating. In this embodiment mode, the second conductive layers 23 to 28 are to have a three-layer structure: a first layer is titanium, a second layer is aluminum, and the third layer is titanium.

Figure 2E:
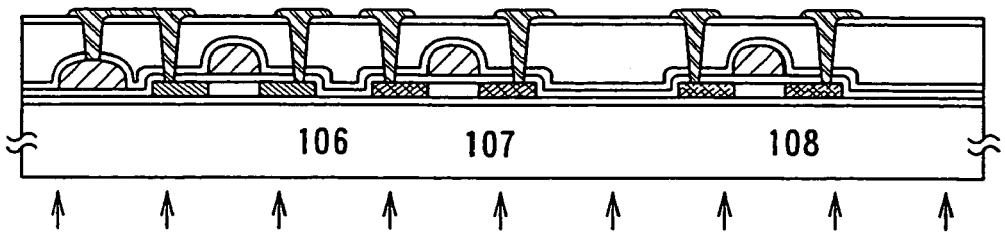

Subsequently, heat treatment is carried our in order to make the viscosity of the discharged composition desired value (FIG. 2E). Here, a laser beam having a beam spot formed into a linear shape is used for irradiation as heat treatment.

Figure 3A:
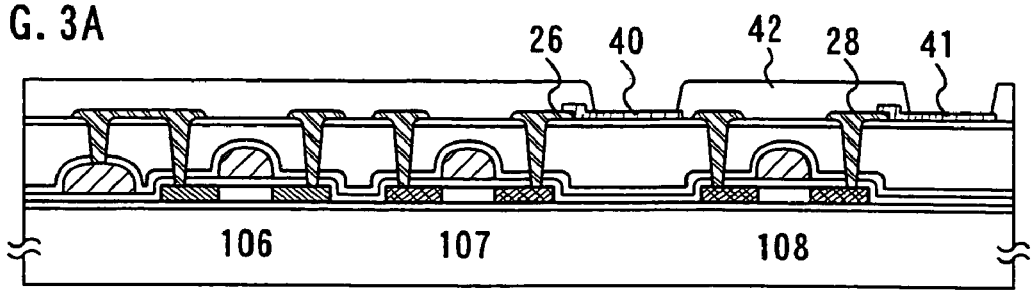
FIGS. 3A to 3D are cross sectional views explaining a manufacturing method of the present invention.

According to the steps so far, transistors can be formed over the substrate 101 having an insulating surface. Then, the first electrodes 40 and 41 formed of a transparent conductive material are formed so as to electrically connect to the wirings 26 and 28 of the TFTs for driving 107 and 108 (FIG. 3A). The first electrodes 40 and 41 are preferably formed of a material having a larger work function, for an example, a compound of indium oxide and tin oxide (ITO), a compound of indium oxide and zinc oxide, zinc oxide, tin oxide, indium oxide, titanium nitride or the like can be used. In the embodiment mode, an ITO film is formed to have a thickness of 0.1 μm by sputtering as the first electrodes 40 and 41.

The first electrodes 40 and 41 may be formed by discharging the conductive material. In that case, a material in which the above-mentioned material having a large work function is dissolved or dispersed in a solvent is used. The conductive layers can be selectively formed by using a method of discharging the conductive material. The manufacturing cost can be reduced and the manufacturing time can be shortened since the following photolithography step is not required to be performed and the manufacturing steps can be simplified.

Next, an insulating film 42 is formed so as to cover the end faces of the first electrodes 40 and 41. The material for forming the insulating film 42 is not specifically limited and an inorganic or an organic material can be used. However, it is preferable to form the insulating film using a photosensitive organic substance since the electroluminescent layer can be deposited without a break according to the shape of the opening portion. In this embodiment mode, the insulating film is formed of a positive type photosensitive resin. Therefore, the opening portion is to be a curved shape having the curvature radius in the upper portion of the insulating film. The insulating film 42 serves not to intermingle with the electroluminescence which is formed later.

Then dust and the like are removed by wiping with a porous material of polyvinyl alcohol system (PVA). In this embodiment mode, fine powder (dust) generated when ITO or an insulating film is etched is removed by wiping with a porous material of polyvinyl alcohol system (PVA).

Figure 3B:
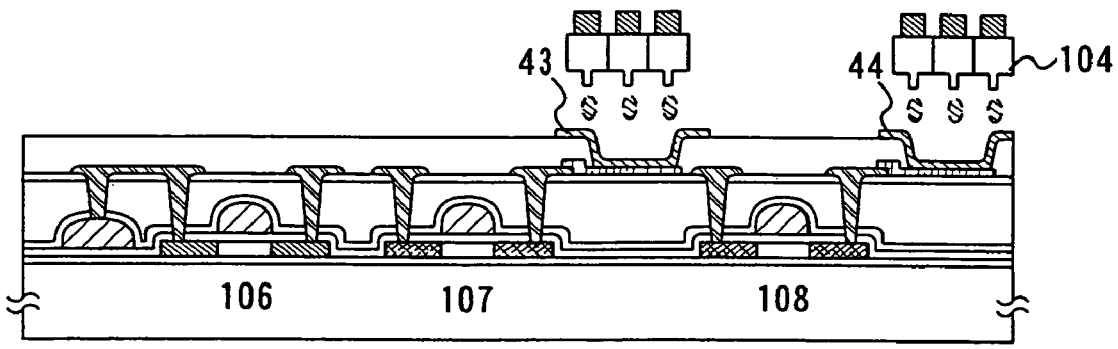

Electroluminescent layers 43 and 44 are formed by ink-jet, namely by discharging the conductive materials under reduced pressure so as to contact with the first electrodes 40 and 41 (FIG. 3B). Materials for electroluminescent layers 43 and 44 are not specifically limited. However, when color display is conducted, materials of each color: red, green, and blue, are used. Here, one layer or plural layers provided between the first and the second electrodes which constitute a light-emitting element is referred to as electroluminescent layers 43 and 44. The electroluminescent layers 43 and 44 can be formed by using materials selected from the group consisting of: a low molecular weight organic compound material, a polymeric organic compound material, and mixtures thereof. Further, a mixed layer in which an electron transporting material and a hole transporting material are appropriately mixed, or a mixed junction in which a mixed region is formed in the junction interface of each material may be formed. In addition to the organic materials, an inorganic light emitting material may be used. Further, the structure of the electroluminescent layers 43 and 44 is not particularly limited, and a structure wherein layers formed of low molecular materials are laminated or a structure wherein layers formed of polymer materials and layers formed of low molecular weight materials are laminated may be adopted.

Figure 3C:
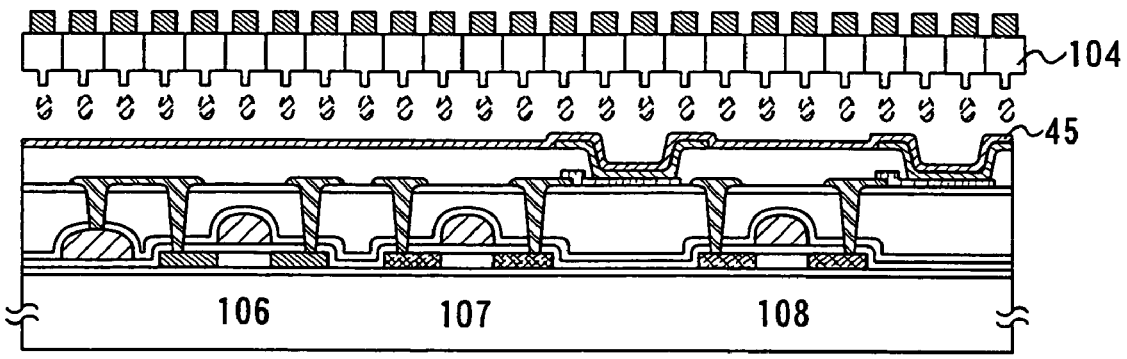
Figure 4:
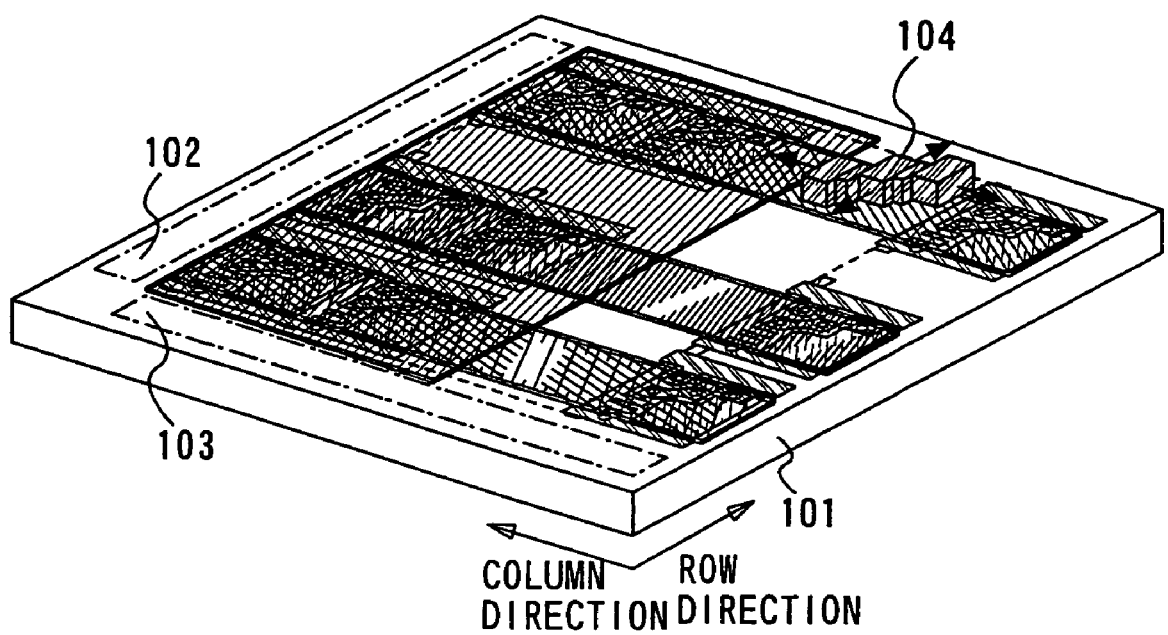
FIG. 4 is a perspective view explaining a manufacturing method of the present invention.

Subsequently, the second electrode 45 is formed under reduced pressure by ink-jet, namely by discharging a conductive material over the electroluminescent layers 43 and 44 (FIG. 3C). The perspective view is shown in FIG. 4.

The second electrode (cathode) 45 is formed of a laminated film of a thin film including a metal having a small work function (lithium (Li), magnesium (Mg), cesium (Cs)) and a transparent conductive film laminated over the thin film including Li, Mg, or the like. The film thickness is properly set so as to serve as a cathode, here; it is set to 0.1 μm to 1 μm. The second electrode 45 is formed over the whole area.

Metal films containing an element in periodic table group 1 or group 2 are often used as the cathode. Since these metal films are easily oxidized, it is preferable to protect the surface of the film. Further, the required film thickness is thin, and therefore a conductive film having a low resistivity is supplementarily provided for lowering the resistance of the cathode, and in addition, protecting the cathode. A metal film in which aluminum, copper, or silver is the main constituent is used as the lower resistivity conductive film.

The electroluminescent layers 43 and 44, and the electrode 45 can be formed by changing a composition discharged from an ink head 104 or changing a ink head 104 filled with the composition. In this case, the electroluminescent layers 43 and 44, and the electrode 45 can be formed without being exposed to the air, therefore, higher reliability of a light emitting element that has a weakness for moisture can be obtained.

Figure 3D:
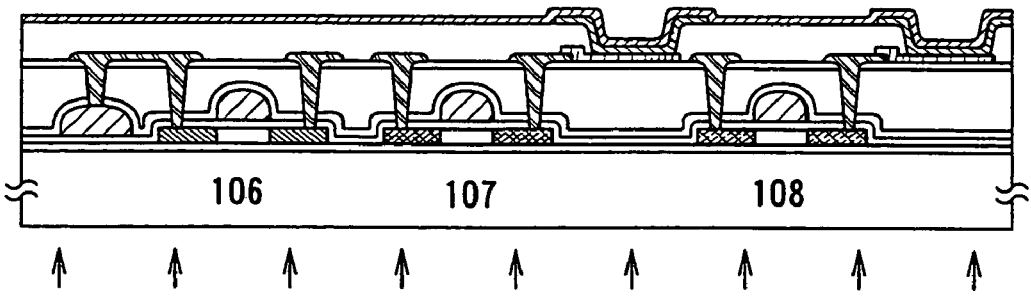

Heat treatment is performed within the range of from 150° C. to 300° C. (in wider range, from 50° C. to 800° C.) for the purpose of obtaining the desired viscosity of the composition discharged from the ink head (FIG. 3D). In the embodiment mode, the film is irradiated with a laser beam having a beam spot shaped into a linear shape as the heat treatment.

The laminated body of the first electrode 40, the electroluminescent layer 43 and the second electrode 45, which are formed in the above-described steps is equivalent to a light-emitting element. The first electrode 40 is equivalent to anode and the second electrode 45 equivalent to cathode, respectively. There are single excitation and triplet excitation as the excitation state for a light-emitting element, and luminescence can be generated by either excitation states.

Figure 5A:
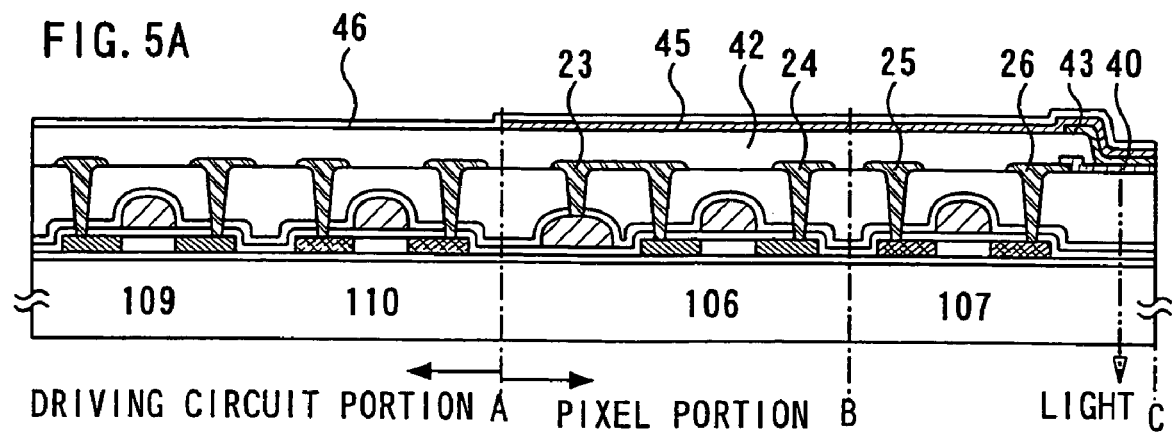
FIGS. 5A to 5C are cross sectional and top views of a pixel.

Then, a protective film 46 is formed over the insulating film 42 and the second electrode 45 (FIG. 5A). A film which is hardly penetrated by a substance such as oxygen or moisture that becomes a cause of accelerating degradation of a light emitting element, compared to the other insulating film is used as the protective film 46. Typically, a DLC film, a carbon nitride film, a silicon nitride film formed by RF sputtering, or the like is used. The film thickness thereof is preferably and approximately 10 nm to 200 nm. In this embodiment mode, a silicon nitride film is formed to have a thickness of 100 nm by sputtering.

Figure 5B:
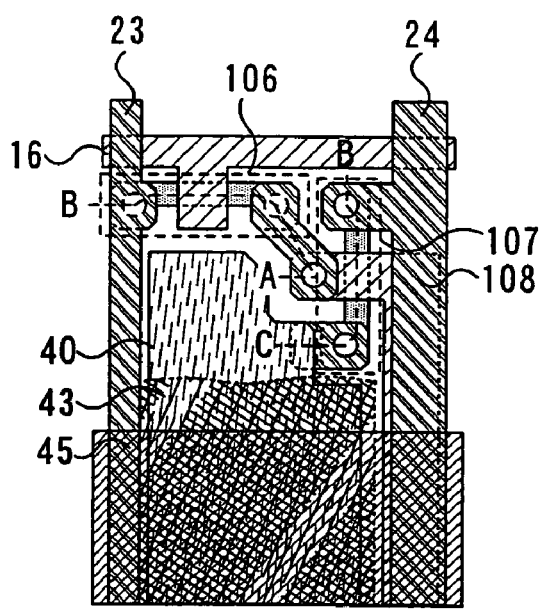
Figure 5C:
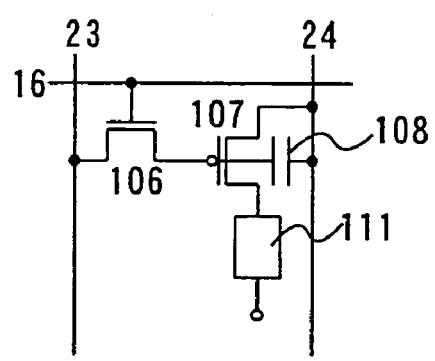

FIG. 5B shows a top view of a pixel in a display device using a light-emitting element. In the top view of FIG. 5B, a cross sectional view which is equivalent to A-B-C is corresponding to FIG. 5A. Also, FIG. 5C shows a circuit diagram of the pixel corresponding to FIG. 5B. Reference numeral 16 denotes a signal line, 23 denotes a scanning line, 24 denotes a power line, 106 denotes a TFT for switching, 107 denotes a TFT for driving, 108 denotes a capacitor element, and 11 denotes a light emitting element.

In this embodiment mode, the case where bottom emission in which light emitted from a light-emitting element is taken out from the side of the substrate 100 (bottom face) is performed is shown. However, upper emission in which light is taken out from the surface of the substrate 100 may be performed, instead. In that case, the first electrodes 40 and 41 are formed so as to correspond to the cathode, and the second electrode 45 is formed so as to correspond to the anode. Further, the second electrode 45 is preferably formed of a transparent material. Also, the TFT for driving 107 is preferably formed of an n-channel TFT. However, the conductive type of the TFT for driving 107 may be properly changed; the capacitor element 108 is to be arranged so as to keep the voltage between the gate and the source. In this embodiment mode, a display device using a light-emitting element is illustrated by an example; however, the present invention can be applied to a liquid crystal display device using a liquid crystal element or other display devices.

The invention having the above-described constitution is capable of responding to a large sized substrate. And a method for manufacturing a wiring, a conductive layer and a display device in which a throughput and efficiency in the use of a material is enhanced, can be provided.

Embodiment Mode 2

Embodiment mode of the present invention is described with reference to FIGS. 6A to 6C and 7A to 7E. Here, a manufacturing step of forming an n-channel type TFT (for switching), a p-channel type TFT (for driving), and a capacitor element in the same substrate is described.

Figure 7A:
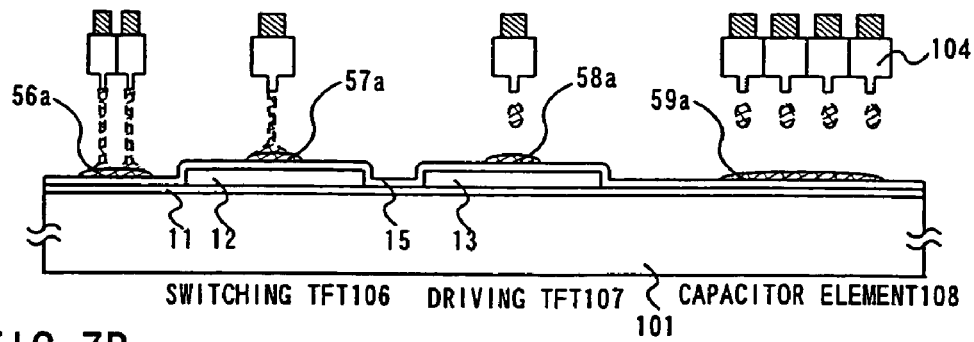
FIGS. 7A to 7E are cross sectional views explaining a manufacturing method of the present invention.

First, a base film 11, a semiconductor layers 12 and 13, and a gate insulating film 15 are formed over a substrate 101 in sequence in the same way as that of Embodiment Mode 1 (FIG. 7A).

Figure 6A:
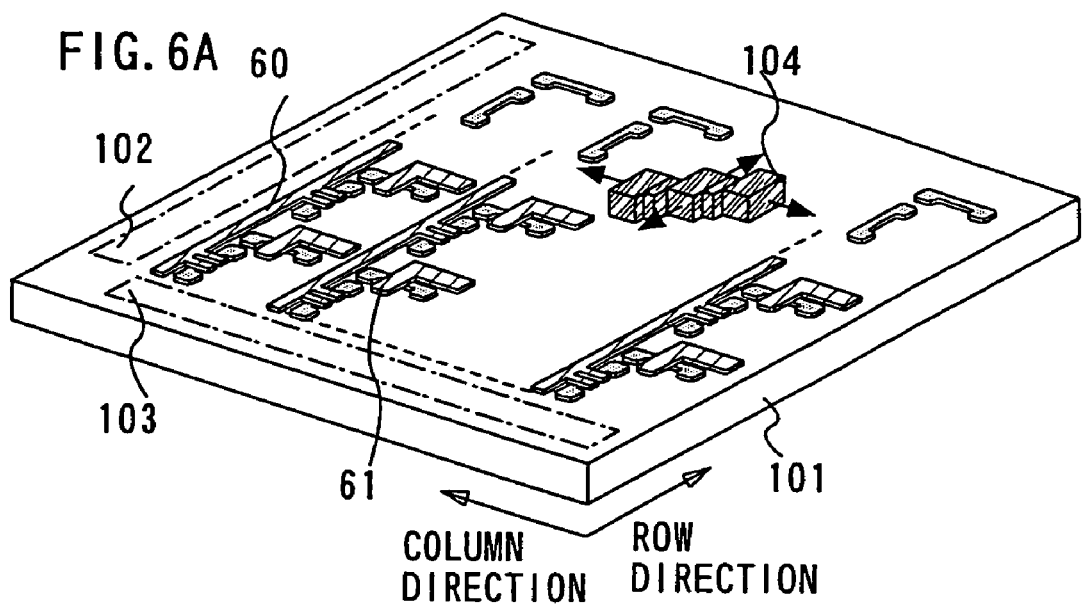
FIGS. 6A to 6C are a perspective view explaining a manufacturing method of the present invention, and cross sectional views of a ink head.
Figure 6B:
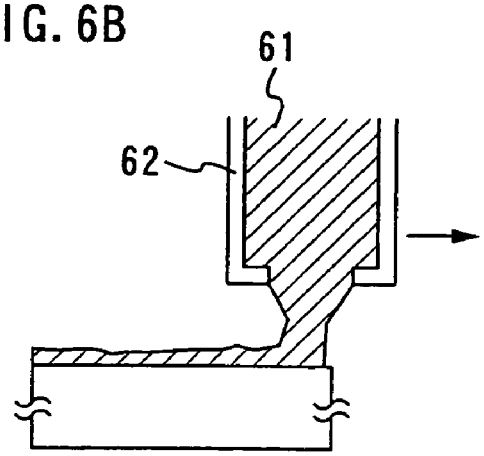
Figure 6C:
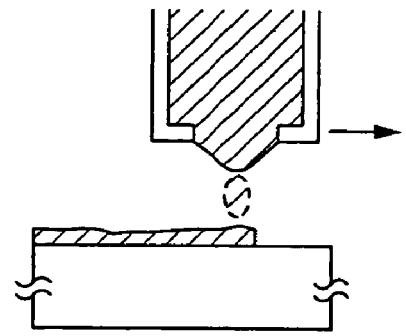

Subsequently, the first conductive layers (gate wirings, gate electrodes,) 56a to 59a are formed under reduced pressure by ink-jet. The perspective view is shown in FIGS. 6A to 6C and the cross sectional view is shown in FIG. 7A.

Although not shown in the drawings, a nozzle included in an ink head 104 is preferably arranged in a line in columns.

According to this, the first conductive layers 56a to 59a can be formed only by scanning the ink head 104 once in rows on a substrate 101. The composition discharged from the ink head is formed in a single structure or a laminated structure by using the one in which a material having a know conductivity is dissolved or dispersed in a solvent. In this embodiment mode, the first conductive layers 56a to 58a is formed using titanium.

Here, a scanning line 60 is to be a main wiring, and a capacity wiring 61 is to be a secondary wiring. It is characterized that the main wiring is different from the secondary wiring in the discharging method of the composition from the ink head 104. The scanning line 60 that is a main wiring is formed by discharging the composition from the ink head in sequence without stopping discharging as shown in FIG. 6B. On the other hand, the capacity wiring 61 is formed by dropping the composition from the ink head, namely, by selectively dropping the composition as shown in FIG. 6C. Note that the reference numeral 61 denotes a composition, 62 denotes an ink head in FIGS. 6B and 6C. This characteristic is also shown in FIG. 7A, a gate wiring 56a and a gate electrode 56b of a TFT for switching 106 are formed by discharging the composition in sequence since the gate wiring 56a and the gate electrode 56b correspond to the main wiring. Further, a gate electrode 58a of the TFT for driving 107 and an electrode 59a of the capacitor element 108 are formed by dropping the composition since the gate electrode 58a of the TFT for driving 107 and the electrode 59a of the capacitor element 108 correspond to the secondary wirings.

Figure 7B:
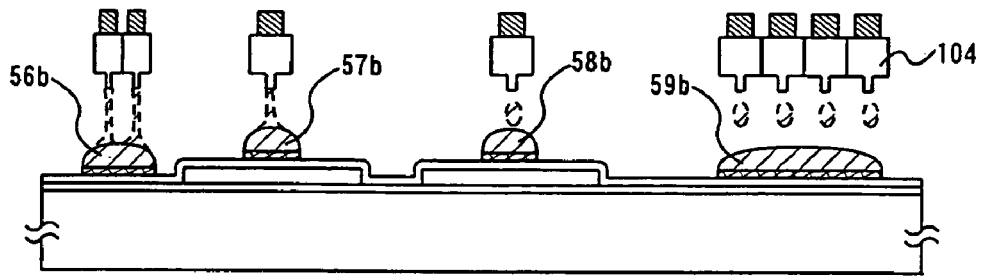

Then, the second conductive layer is formed by the same method as forming the above-described first conductive layer. In the embodiment mode, the second conductive layers 56b to 59b are formed using copper or aluminum (FIG. 7B). The amount of the drop for the second conductive layer is set to be different form that of the drop for the first conductive layer so that the second conductive layer is thicker than the first conductive layer.

Figure 7C:
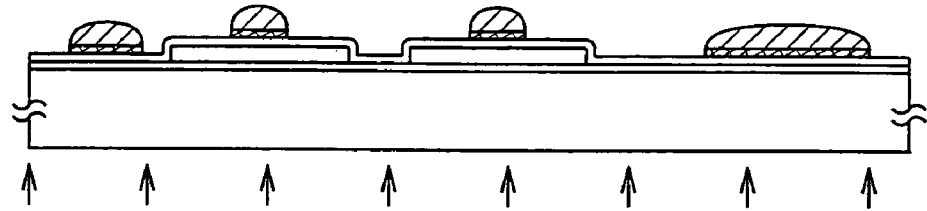

Heat treatment or UV treatment is performed over the substrate provided with the first and the second conductive layers (FIG. 7C). In this treatment, the viscosity of the composition is to be desired level by volatilizing a solvent of the composition so as to endure press treatment. The heat treatment is performed by a lamp annealing apparatus, a laser irradiation apparatus, an annealing furnace set at the determined temperature, or the like. In this embodiment mode, a laser beam irradiation is carried out for the heat treatment.

Figure 7D:
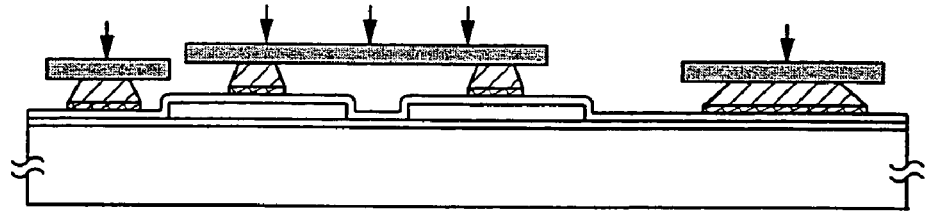

In addition, a substrate covered with polytetrafluoroethylene and the like is used for performing the press treatment to make a flat substrate (FIG. 7D). Instead of pressing, buffing, electro polishing, complex electro polishing and the like may be used. According to this, microscopic unevenness can be eliminated, thereby planarizing the film.

Figure 7E:
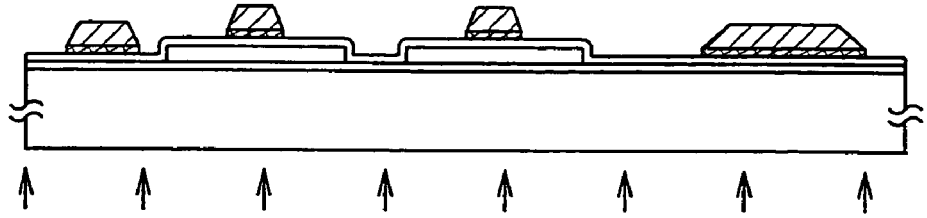

Then, the second heat treatment is performed for the purpose of obtaining the desired level of the viscosity of the first and the second conductive layers (FIG. 7E). A laser beam irradiation is performed for the heat treatment in this embodiment mode. The steps of the heat treatment is not required to be performed plural times, the steps can be put together, and only one step of the heat treatment may be performed as necessary.

According to the above steps, a desired wiring can be formed. In the embodiment mode, an example of forming the gate wiring and the gate electrode is shown, however, the present invention is not limited thereto, and the embodiment mode may be applied to the formation of a source wiring or other wirings, a pixel electrode included in a display element, a counter electrode, and the like.

This embodiment mode can be freely combined with Embodiment Mode 1.

Embodiment Mode 3

In this present embodiment mode, a liquid crystal display panel made by a transistor which is composed of an amorphous semiconductor (amorphous silicon) is described with reference to the drawing. The present invention can be applied to the formation of gate and source wirings, a drain wiring, and the like.

Figure 14A:
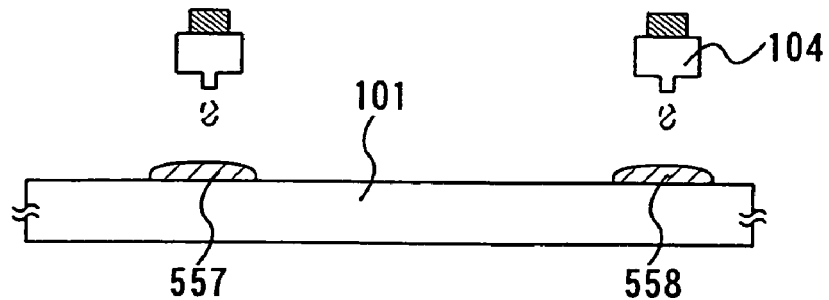
FIGS. 14A to 14E are cross sectional diagrams explaining a manufacturing method of the present invention.

A substrate 101 is formed of various materials such as glass, quartz, a semiconductor, a plastic, a plastic film, metal, a glass epoxy resin, and ceramic. Conductive layers 557 and 558 are formed over the substrate 101 by ink-jet, that is by discharging a composition having known conductivity under reduced pressure (FIG. 14A). According to the present invention in which the conductive layer is formed by ink-jet, efficiency in the use of a material can be widely enhanced since the conductive layer can be formed only on the desired area.

Figure 14B:
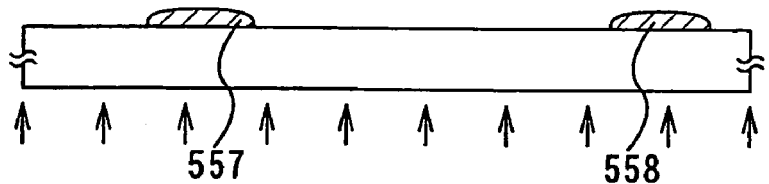

The heat treatment is performed over the substrate in which the conductive layers 557 and 558 are formed within the range of from 150° C. to 300° C. under reduced pressure. Therefore, the solvent is volatilized and the viscosity of the composition which constitutes the conductive layers 557 and 558 is set to the desired level (FIG. 14B). The heat treatment may be performed every time a thin film is formed by ink-jet or every optional step, or after finishing the whole steps.

Figure 14C:
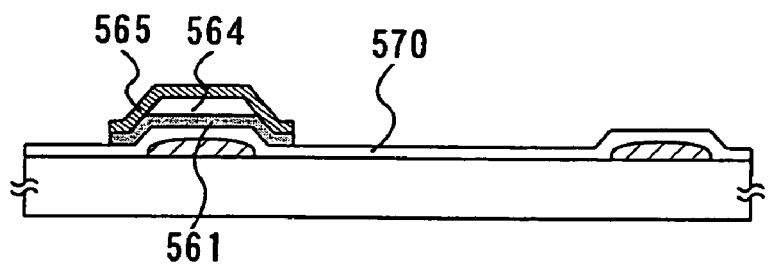

Then, a gate insulating film 570 is formed by a known method such as CVD. In this embodiment mode, a silicon nitride film is formed at atmospheric pressure as the gate insulating film 570 by CVD (FIG. 14C).

An active semiconductor layer 561 is formed in a thickness of from 25 nm to 80 nm (preferably, 30 nm to 60 nm) by a known method (sputtering, LPCVD, plasma CVD, and the like). The active semiconductor layer 561 is formed of a compound semiconductor film and the like having an amorphous structure such as an amorphous semiconductor film, or amorphous silicon germanium film. The compound semiconductor film and the like are formed over the whole surface of the substrate 101, and pattern processing is carried out thereto to form a desired shape, namely, the active semiconductor layer 561.

A channel protective film 564, and a semiconductor layer 565 doped with an impurity element imparting n-type conductivity are formed. The semiconductor layer 565 electrically connects the active semiconductor layer 561 and source and drain wirings which are formed in a later step.

The steps of forming the semiconductor layer 561, the channel protective layer 564 and the semiconductor layer 565 are described in detail as below. First, the first semiconductor layer and the insulating layer are laminated over the whole surface of the gate insulating film 570. Next, the insulating layer is pattern-processed to form a channel protective film 564. Then, the second semiconductor layer is formed over the whole surface of the first semiconductor layer and the channel protective film 564. Thereafter, the first and the second semiconductor layers are pattern-processed at the same time to form the semiconductor layers 561 and 565. FIG. 14C shows the semiconductor layer 561, the channel protective film 564, and the semiconductor layer 565 which are formed through the described steps.

Figure 14D:
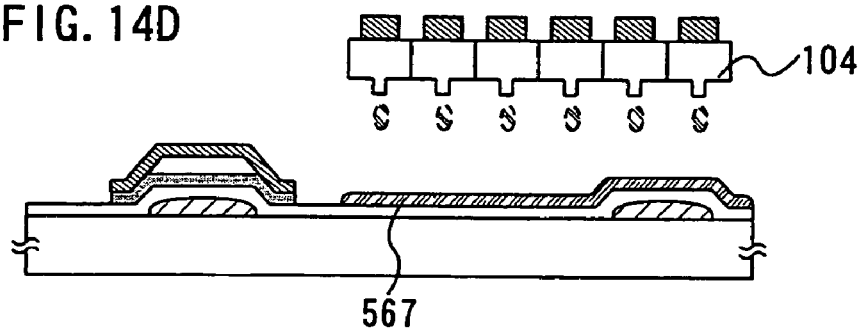

A conductive film (pixel electrode) 567 is formed under reduced pressure by ink-jet (FIG. 14D). The composition discharged from the ink head 104 is formed of the one in which a known conductivity material is dissolved or dispersed in a solvent. When the conductive film 567 is formed by ink-jet, the conductive film can be formed only in the desired area. Therefore, the wasted material can be reduced and, the efficiency in the use of the material can be enhanced.

Figure 14E:
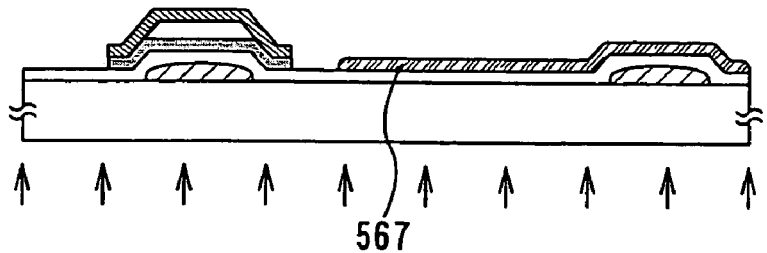

Then, heat treatment is performed so that the viscosity of the obtained pixel electrode 567 is set to the desired level (FIG. 14E).

Figure 15A:
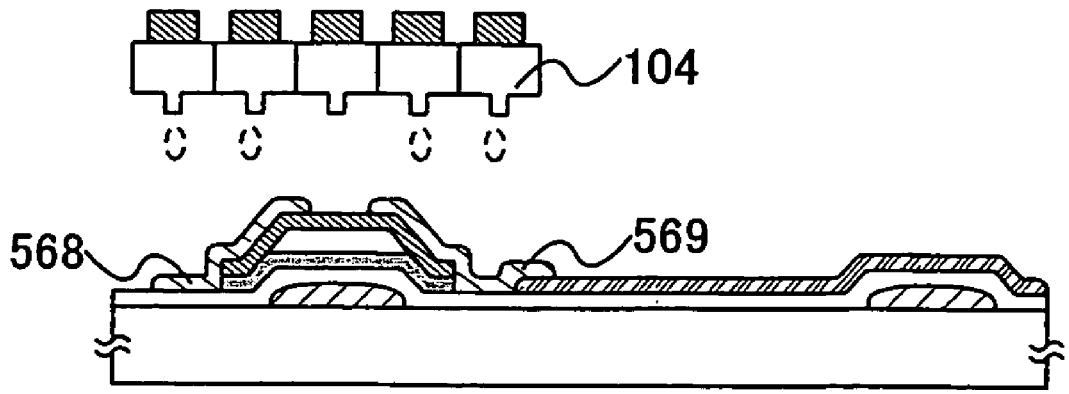
FIGS. 15A to 15C are cross sectional diagrams explaining a manufacturing method of the present invention.
Figure 15B:
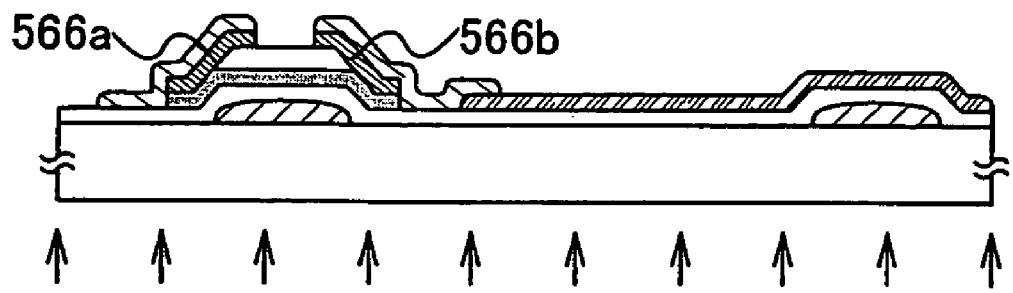

Subsequently, conductive films 568 and 569 are formed under reduced pressure by ink-jet (FIG. 15A). And heat treatment is performed so that the viscosity of the manufactured source and drain wirings (conductive films 568 and 569) is the desired level (FIG. 15B). Then, n-type semiconductor layers 566a and 566b are formed by etching selectively.

Figure 15C:
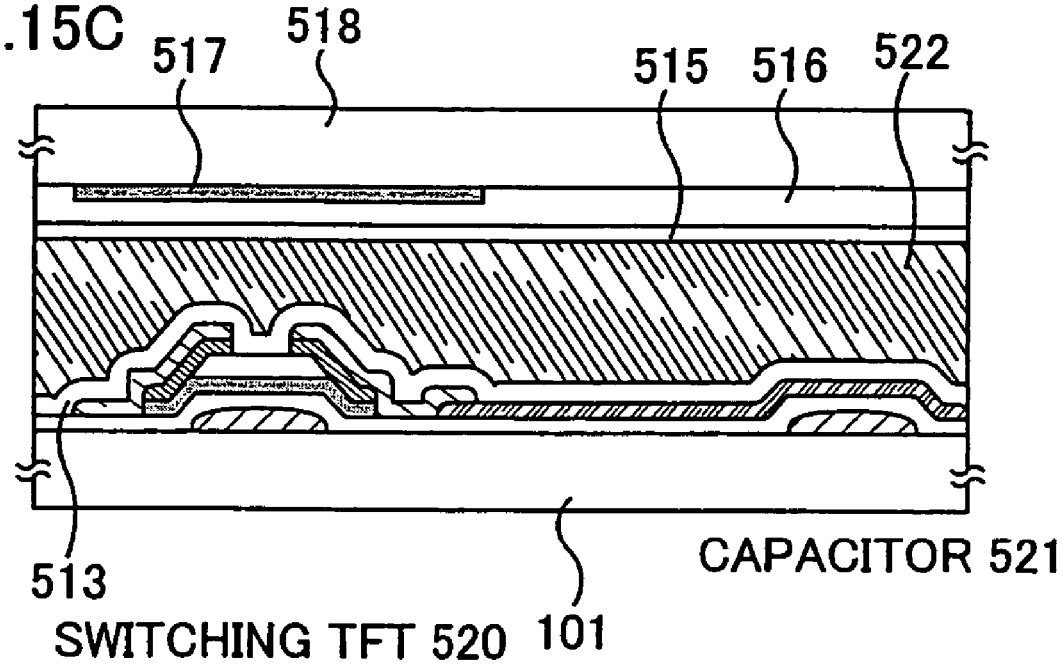

After manufacturing a protective film 513 formed of silicon nitride and the like, the protective film and a counter substrate 518 in which a common electrode 515, a color filter 516, a black matrix, and the like are formed are laminated. And liquid crystal 522 is injected with the predetermined method (FIG. 15C).

Figure 16:
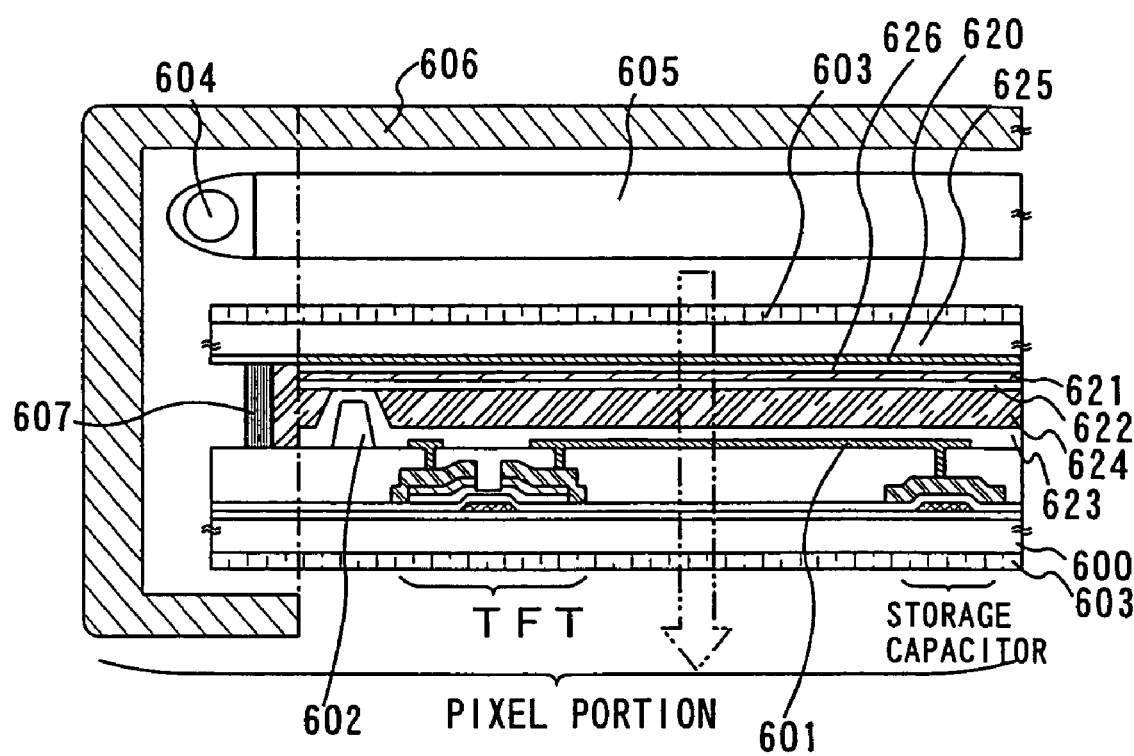
FIG. 16 is a diagram showing a display panel.

A step for manufacturing an active matrix liquid crystal display device is described as below with reference to FIG. 16.

First, an active matrix substrate is formed of a substrate 600 that is transparent to light. The substrate with a large area as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm is desirably used thereby reducing manufacturing costs. A substrate made of barium borosilicate glass, aluminoborosilicate glass, and the like, as typified by #7059 glass or #1737 glass produced by Corning Inc. can be used. In addition, a transparent substrate such as a quartz substrate or a plastic substrate can be used alternatively.

A wiring and an electrode (a gate electrode, a storage capacitor wiring, a terminal, and the like) is formed over the substrate having an insulating surface by ink-jet under reduced pressure. Note that, a base insulating film is formed over the substrate 600, if necessary.

An element selected from a group consisting of Ti, Ta W, Mo, Cr, and Nd, an alloy containing the elements, or a nitride containing the elements may be used for a material of the wiring or the electrode. Further, a plurality of materials selected from an element selected from the group consisting of Ti, Ta W, Mo, Cr, and Nd; an alloy containing the elements in major proportion; or a nitride containing the elements in major proportions may be laminated.

When the screen size becomes larger, a problem of higher wiring resistance is generated and an increase in power consumption is caused because the length of each line is increased. Accordingly, the wirings and electrodes may be formed with a material selected from the group consisting of Cu, Al, Ag, Au, Cr, Fe, Ni, or Pt or an alloy thereof so as to achieve the low power consumption.

Subsequently, a gate insulating film is deposited entirely over the substrate by PCVD. The gate insulating film is formed with a lamination of a silicon nitride film and a silicon oxide film so as to have a thickness of 50 nm to 200 nm, preferably 150 nm. Note that the gate insulating film is not necessarily be a lamination; and a silicon oxide film, a silicon nitride film, a silicon oxynitride film, tantalum oxide film, or the like may be used alternatively.

Next, a first amorphous semiconductor film is formed over the gate insulating film using known techniques such as plasma CVD or sputtering with a thickness of 50 nm to 200 nm, preferably 100 nm to 150 nm. Typically, an amorphous silicon (a-Si) film is formed into a thickness of 100 nm. Note that, when the films are formed over a substrate with a large area, the chamber is also enlarged, and if the inside the chamber is evacuated, more treating time and a large amount of film formation gas are required. Accordingly, the amorphous silicon (a-Si) film may be formed by linear plasma CVD apparatus under the atmospheric pressure.

Thereafter, the second amorphous semiconductor film with a thickness of 20 nm to 80 nm, which contains an impurity element having one conductive type (n-type or p-type) is formed. The second amorphous semiconductor film including an impurity element that imparts one conductivity is deposited all over using known techniques such as plasma CVD or sputtering. In this embodiment, the second amorphous silicon film containing an n-type impurity element is deposited by using a silicon target being added with phosphorus.

Next, a resist pattern is formed by the photolithography process, and an unnecessary portion is etched away, thereby forming the first amorphous semiconductor island film and the second amorphous semiconductor island film. On this occasion, etching is carried out by wet etching or dry etching.

A wiring, an electrode (a source wiring, a drain wiring, a storage capacitor electrode and the like) for covering the second amorphous semiconductor island film is formed by ink-jet under reduced pressure. An element selected from the group consisting of elements such as Al, Ti, Ta W, Mo, Cr, Nd, Cu, Ag, Au, Fe, Ni, and Pt, or an alloy of the elements may be formed as materials for the wirings and the electrodes.

As described above, the source wiring, the drain wiring, the capacitor electrode are formed. At this stage, the storage capacitor in which the insulating film formed of the same material as the gate insulating film is to be derivatives is formed. Then, the one part of the second amorphous semiconductor film is removed in a self-alignment manner, and the one part of the first amorphous semiconductor film is thinned. The region to be thinned becomes a channel formation region of the TFT.

A protective film formed of a silicon nitride film with a thickness of 150 nm and a first interlayer insulating film formed of a silicon oxynitride film with a thickness of 150 nm are formed all over by plasma CVD. Note that, in the case where the films are formed over a substrate with a large area, the chamber is also enlarged and if the inside the chamber is evacuated, more treating time and a large amount of a film formation gas are required. Accordingly, the amorphous silicon (a-Si) film may be formed by linear plasma CVD under the atmospheric pressure. Thereafter, a channel etch TFT is manufactured by hydrogenation.

Note that, a channel etch type is given as an example of a TFT structure; however, the structure is not limited thereto. Any one of the structures of a channel stopper type TFT, a top gate TFT, or a staggered TFT may be applied.

Next, a photolithography process is carried out; a resist pattern is formed; a contact hole reaching to a drain electrode or a storage capacitor electrode is formed by dry etching. Concurrently, a contact hole (not illustrated) for connecting gate wiring and a terminal portion may be formed in the terminal area, and a metal wiring (not shown) which electrically connects gate wirings and the terminal portion may be formed. Further, a metal wiring for leading out from a source wiring may be formed after forming the contact hole which reach to the source wiring (not shown) at the same time. A pixel electrode formed from ITO or the like may be formed after the above metal wirings are formed, or the metal wirings may be formed after the pixel electrode formed from ITO or the like is formed.

An indium oxide tin oxide alloy (ITO), an indium oxide zinc oxide alloy ($In_2O_3$—ZnO), zinc oxide (ZnO), and the like are applied to form a transparent electrode film having a thickness of 110 nm under reduced pressure by ink-jet, thus forming a pixel electrode 601.

As described above, an active matrix substrate comprising a pixel portion having a source wiring, an inversely staggered TFT, a storage capacitor, and a terminal portion can be manufactured.

An orientation film 623 is formed over the active matrix substrate and rubbing treatment is performed thereto. Before forming the orientation film 623, a columnar spacer 602 for keeping the substrate interval is formed in the desired area by patterning the organic resin film such as an acrylic resin film. In addition to the columnar spacer, a spherical spacer may be applied to the whole surface of the substrate.

A counter substrate 625 is prepared. The counter substrate 625 is provided with a color filter 620 in which a light-shielding layer (not shown) is arranged in response to each pixel. In addition, a planarization film 626 is provided so as to cover the color filter 620 and the light-shielding layer. Then, a counter electrode 621 formed of a transparent conductive film is formed over the planarization film 626 so as to overlap with a pixel portion. The orientation film 622 is formed over the whole surface of the counter substrate 625, and rubbing treatment is performed thereto.

After forming a sealant 607 so as to surround the pixel portion of the active matrix substrate, liquid crystal is discharged over the region surrounded by the sealant under reduced pressure by ink-jet. The active matrix substrate and the counter substrate are bonded under reduced pressure with the sealant 607. A filler (not shown) is mixed in the sealant 607. Therefore, the two substrates are bonded with an even interval by the filler and the columnar spacer 602. According to the method in which the liquid crystal is discharged by ink-jet, the amount of the liquid crystal used for the manufacturing steps can be reduced, and the cost required when using a large sized substrate can be widely reduced.

Thereupon, in this embodiment mode, the substrate is pasted to the counter substrate provided with the sealant 607 after the liquid crystal material is discharged (or dripped) only over the pixel electrode that are formed over the substrate, that is, over the pixel portion by employing ink-jet under reduced pressure. Both of applying the sealant and dripping of the liquid crystal may be performed on the counter substrate or on the substrate provided with the pixel portion.

A piezo system that is applied for ink-jet printers may be employed for ink-jet since controllability of an ink drop is higher and the kind of ink can be selected freely. Note that, the piezo system has two types: a MLP (Multi Layer Piezo) type and a ML Chip (Multi Layer Ceramic Hyper Integrated Piezo Segments).

In this embodiment mode, a liquid crystal display device can be manufactured by discharging (or dripping) a few drops of a small amount of liquid crystal toward a pixel electrode. By using ink-jet, the small amount of the liquid crystal such as the number of discharging and the number of the discharging point can be freely adjusted.

It is preferable to discharge (or to drip) the liquid crystal by ink-jet under reduced pressure thereby preventing impurities from being mixed. While the liquid crystal is discharged (or dripped), the viscosity of the liquid crystal is set to the desired level by heating the substrate. Further, the film thickness may be uniformed by spinning the substrate after the application of the liquid crystal by ink-jet, if necessary. It is preferable to paste the substrates under reduced pressure to prevent bubbles from being mixed thereinto.

As described above, because the needed volume of the liquid crystal is dropped into the needed area, thereby eliminating the loss of the material. Further, since the seal pattern is to be a closed loop, a liquid crystal inlet and a seal material become unnecessary. Therefore, the defect (such as an orientation defect, for example.) which is generated when the liquid crystal is injected may be eliminated.

A material of the liquid crystal is not limited particularly as long as it can be discharged from a nozzle by ink-jet; the liquid crystal material may be mixed with a photo-curing material, thermosetting material, or the like thereby improving the adhesion between the pair of substrates after the injection of the liquid crystal.

It is preferable that a material that does not dissolve in or react to a liquid crystal even when it touches the liquid crystal be selected for a seal material.

The gap between the pair of substrates may be maintained by sprinkling spherical spacers, forming a columnar spacer formed of resin, or mixing fillers into the seal material.

Thus, an active matrix liquid crystal display device can be manufactured. Note that, if necessary, the active matrix substrate or the counter substrate is cut into a desired shape. Further, an optical film such as a polarizing filter 603 is provided fittingly using known techniques. An FPC is further pasted to the substrate using known techniques.

A liquid crystal module obtained according to the above steps is provided with a backlight 604 and an optical wave guide 605. An active matrix liquid crystal device (transmissive type) is completed by covering the liquid crystal module with a cover 606. A part of the cross section thereof is shown in FIG. 16. Note that, the cover 606 and the liquid crystal module are fixed with an adhesive or an organic resin. The polarizing filter 603 is pasted to the active matrix substrate and the counter substrate, since the liquid crystal display device is a transmissive type.

Further, an example of the transmissive type is shown in this embodiment; however, it is not limited thereto, and a reflective or transflective liquid crystal display device can also be manufactured. When a reflective liquid crystal display device is obtained, a metal film with high reflectance, typically, a material film containing aluminum or silver in major proportions, or a lamination of those may be used for a pixel electrode.

A Liquid crystal display device has mainly two types: a passive type (simple matrix type) and an active type (active matrix type); the present invention can be applied to the either of the types.

This embodiment mode can be freely combined with the other described embodiment modes.

Embodiment 1

The present embodiment is described with reference to FIGS. 8A to 8E. FIGS. 8A to 8E show a cross sectional structure of a thin film transistor.

Figure 8A:
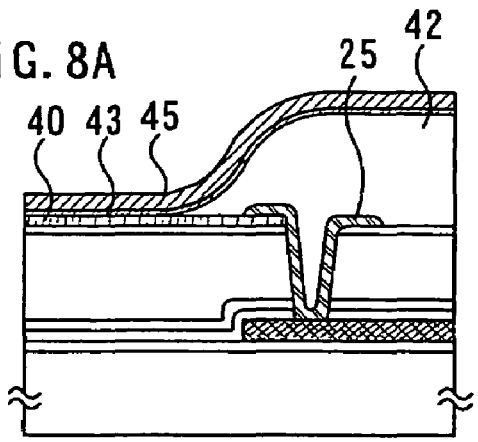
FIGS. 8A to 8E are cross sectional views of a thin film transistor.
Figure 8B:
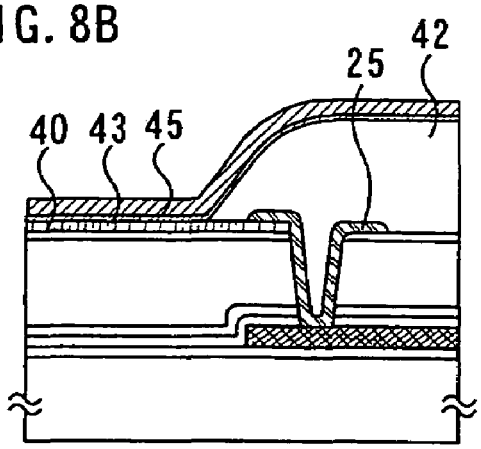
Figure 8C:
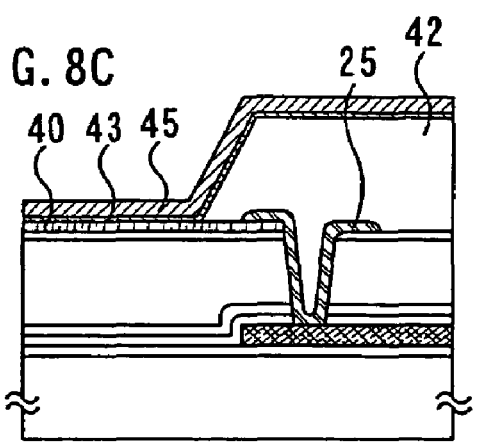
Figure 8D:
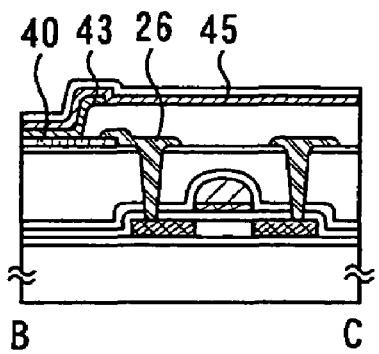
Figure 8E:
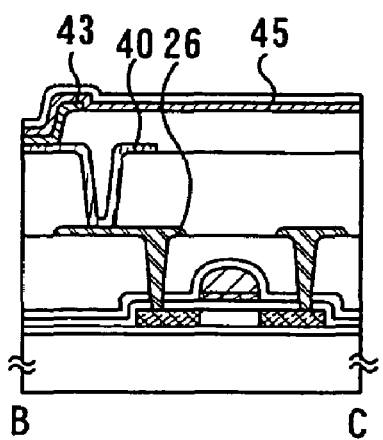

In the above described embodiment modes, a method by which a transparent conductive film is formed so as to electrically connect to the wiring 26 after forming the wiring 26 has been described. The transparent conductive film may be formed by other method. For example, the wiring 26 of a TFT may be formed after forming the transparent conductive film and pattern processing thereto. The cross sectional structure is shown in FIG. 8D. In addition, after forming the wiring 26 of a TFT, an insulating film is formed and a contact hole is formed over the insulating film so as to reach the wiring 26. Then, a transparent conductive film 40 may be formed so as to electrically connect to the wiring 26. The cross sectional structure is shown in FIG. 8E.

In the case of using a negative type photosensitive resin as a material of an insulating film 42 that is a bank, the insulating film 42 is formed to have a curved shape with the first curvature radius in the upper portion of the film and the second curvature radius in lower portion of the film. The first and the second curvature radius is preferably set at 0.2 μm to 3 μm, respectively, and the angle of the pass-through to ITO is preferably set at equal to or more than 35°. In the case of using a positive type photosensitive resin as a material of the insulating film 42, the opening portion is to be a curved shape having the curvature radius in the upper portion of insulating film as shown in FIG. 8B. In addition when the opening portion of the insulating film 42 is manufactured by dry etching, the shape is the one shown in FIG. 8C. The either of the above shapes may be employed in the present invention.

Embodiment 2

Figure 9:
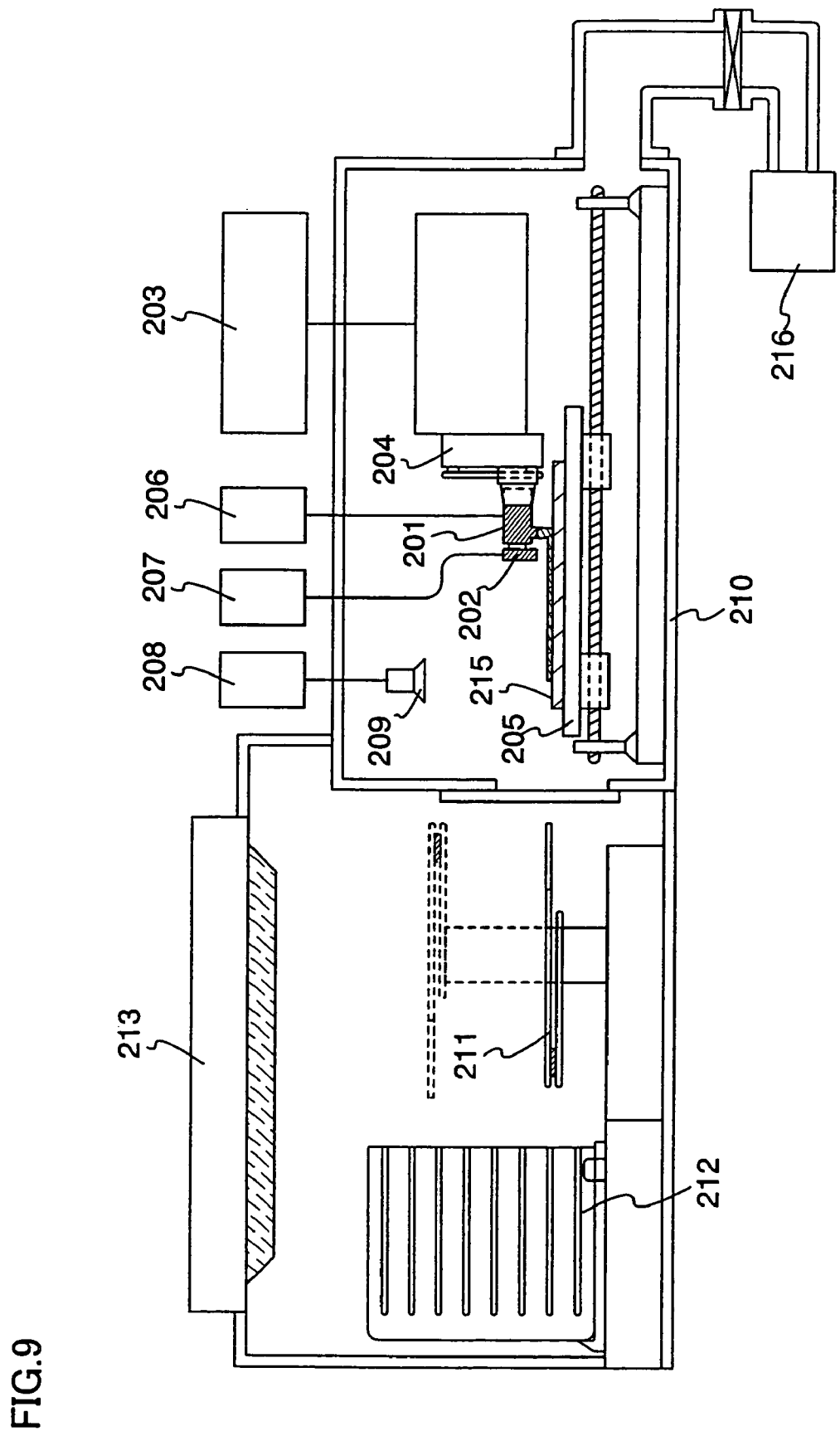
FIG. 9 shows a printer using ink-jet.

This embodiment of the present invention is described with reference to FIGS. 9 and 10. FIG. 9 shows a printer using ink-jet, and FIG. 10 shows a multi chamber.

The discharging period for a composition discharged from an ink head 201 and the movement speed of a substrate are regulated so as to continuously form a wiring pattern on a substrate 215. A nozzle 202 for discharging gas may be provided adjacent to the ink head 201 as a means of smoothing the composition. According to the gas discharged form the nozzle 202, the composition discharged over the substrate 215 is smoothed. A linear pattern is formed by relatively moving the ink head 201 and the substrate, at this time; the pattern can be smoothed by discharging the gas from the nozzle. Further, a gap between the ink head 201 and the substrate 215 is preferably maintained at a distance equal to or less than 1 mm in order to increase the accuracy of the impact position of the discharged composition. Therefore, a structure in which a movement mechanism 204 for moving the ink head 201 upwards and downwards, and a control means 203 are provided, and are brought near to the ink head only during pattern formation is required.

As for other structures, components such as a substrate stage 205 for fixing the substrate 215 by a vacuum chuck and the like while moving the substrate in the XYθ direction, a means 206 for supplying the composition to the ink head 201, a means 207 for supplying the gas to the nozzle 202, and a vacuum evacuation means 216 for evacuating the processing chamber are used. A casing 210 covers parts such as the ink head 201 and the substrate stage 205. If the same gas as the solvent of a composite is supplied thereby the atmosphere in the casing 210 is replaced by using a means 208 for supplying the gas and a showerhead 209 in the casing 210, dryness can be prevented to some extent. Then, printing can be continued for a long time. Other accompanying constituents such as a carrier 212 for holding substrates to be processed, a conveyor means 211 for removing the substrates from and placing the substrates into, and a clean unit 213 for reducing dusts in the work region by sending out clean air may be included.

Figure 10:
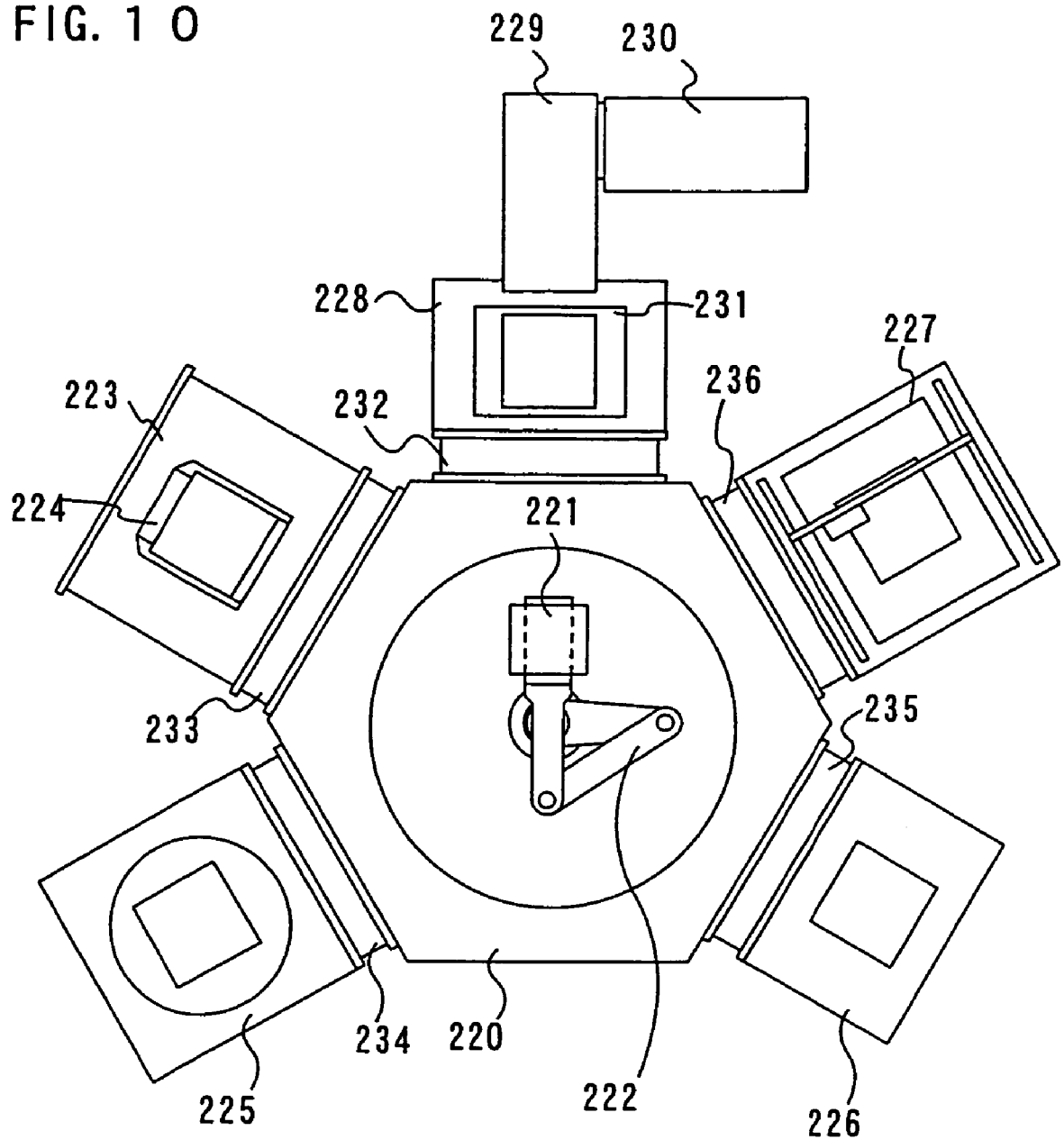
FIG. 10 is a diagram showing a multi chamber.

FIG. 10 shows a structure of a multi chamber in which the above-mentioned printer is incorporated. A conveying chamber 223 which performs loading and unloading of a substrate is also referred to as a load-unload chamber. A carrier 224 in which the substrate is set is placed here. Further, a common chamber 220 contains a mechanism (hereafter referred to as a conveying mechanism) 222 for conveying a substrate 221. Mechanisms such as a robot arm for handling the substrate can be cited as the conveying mechanism 222.

Plural processing chambers are connected to the common chamber 220 through the gates 232 and 236. In the structure of FIG. 10, the common chamber 220 is in the reduced pressure (vapor), and the each of the processing chamber is shut off with the common chamber 220 by the gate 232 to 236. The vacuum pump is provided for the each processing chamber, and is used in vacuum. A rotary oil pump, a mechanical booster pump, a turbo-molecular pump, or a cryo-pump can be used for the evacuation pumps, however, a cryo-pump which is effective for removing moisture is preferably used.

In this invention, a wiring, a conductive layer, and an electroluminescent layer are formed in an ink-jet processing chamber 227. A substrate holding means, an ink head shown in FIG. 9, and the like are provided for the ink-jet processing chamber 227. In the case of forming the electroluminescent layer, the processing chamber 227 is kept in the inert atmosphere since a light emitting material is vulnerable to moisture. After forming the wiring and the conductive film, the process of irradiating with a laser beam is performed in the laser irradiation chamber 228. The laser irradiation chamber 228 which is shut out form the atmosphere includes: a position control means for setting a substrate and controlling the position of the substrate; a laser oscillator 230; an optical system 229; a stage 231, and a computer with a central processing unit (CPU) and a storage means such as a memory.

A film formation processing chamber 225 is a processing chamber for forming a passivation film. A silicon nitride film, a silicon nitride-oxide film, or the like is used to form the passivation film by plasma CVD. Therefore, gas supply systems such as silane ($SiH_4$), nitrogen oxide ($N_2O$), and ammonia ($NH_3$), plasma generation means using high frequency power source, substrate heating means and the like are provided. Since the electroluminescent layer is vulnerable to moisture, after forming the electroluminescent layer, the passivation film is preferably provided in sequence without being exposed to the air. In the multichamber, a film formation chamber may be provided for the purpose of the other thin films in addition to the passivation film.

According to the device having the above-mentioned constitution, the wiring, the electroluminescenece layer, and a cathode are formed by ink-jet. Further, the laser irradiation chamber, and film formation chamber of the passivation film are all installed by multi chamber system. Therefore, for example, the step of manufacturing an electroluminescence layer over the anode formed of a transparent conductive film through the step of manufacturing the passivation film can be performed without being exposed to the air. As a result, a light-emitting element which is resistant to degradation can be formed with simple steps and a higher reliability display device can be manufactured.

The embodiment is freely combined with the other described embodiment.

Embodiment 3

Figure 13A:
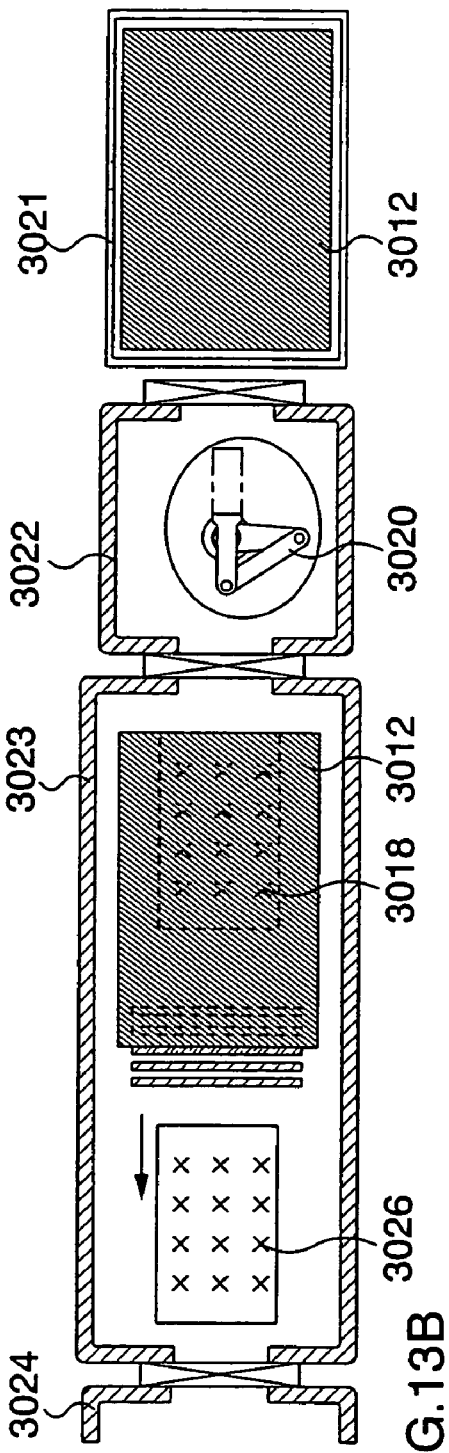
FIGS. 13A and 13B are top and cross sectional views of a plasma processing apparatus.
Figure 13B:
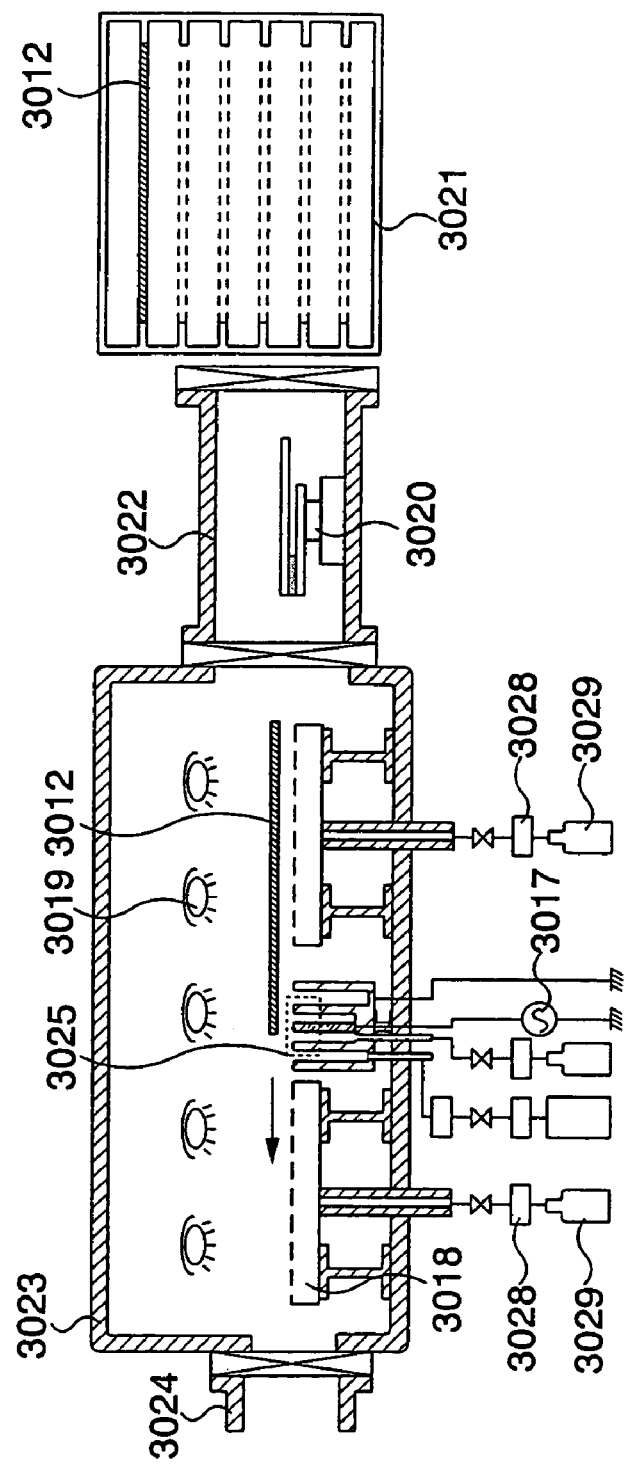

FIG. 13A is a top view of the plasma treatment apparatus of the present invention and FIG. 13B is a cross-sectional view of the plasma treatment apparatus of the present invention. In the FIGS. 13A and 13B, reference numeral 3021 is a cassette chamber for an object to be processed 3012. The object to be processed 3012 such as a glass substrate, a resin substrate, and a semiconductor substrate wherein surface treatment is conducted respectively is set in the cassette chamber 3021. As the object to be processed 3012, a substrate of a desired size is used regardless of the substrate size, that is, a large-sized substrate (for example, 300 mm×360 mm) and a normal size substrate (for example, 127 mm×127 mm). Note that, it is preferable that pretreatment such as cleaning be carried out beforehand for the substrate set in the cassette chamber 3021.

Reference numeral 3022 denotes a transport chamber, and the object to be processed 3012 placed in the cassette chamber 3021 is transported to plasma treatment chamber 3023 through a transport mechanism 3020, for example, a robot arm. In the plasma treatment chamber 3023 adjacent to the transport chamber 3022, airflow control means 3018 for making a flow of an atmosphere in order to cut off the air for the dust proof, and for transporting the object to be processed 3012, a heating means 3019, and a plasma generation means 3025 are provided for the plasma treatment chamber 3023. A known heating means such as a halogen lamp may be used for the heating means 3019, which is used from the reverse side of the object to be processed 3012. The airflow control means 3018 and an exit cone of gas 3026 control the airflow using a transporting gas such as an inert gas provided from a gas supply means 3029. In the present invention, the plasma treatment apparatus is operated under an atmospheric pressure or around atmospheric pressure; therefore, pollution from the external and flow back of reaction product can be prevented by solely controlling airflow near the plasma generation means 3025 by the airflow control means 3018. Accordingly, it is also possible to separate externally solely by the airflow control means 3018, and there is no need to seal the plasma treatment chamber 3023 completely. In addition, in the present invention, it does not need to place a complicated vacuum system. And time for vacuuming and an atmospheric opening which are required for pressure reducing equipment are unnecessary.

Moreover, a gas provided from the gas supply means 3029 is heated to a desired temperature (for example, from 50° C. to 800° C.) by a heating means 3028. And the object to be processed 3012 is heated by blowing this heated gas to the object to be processed 3012. The heating means 3028 is not limited in particular, as long as it can heat a gas, and a known means may be used. In the present invention, the heated gas is blown over the object to be processed 3021, and furthermore, the reverse side of the object to be processed 3012 is heated by the heating means 3019. As mentioned, the object to be processed 3012 is heated uniformly by heating both sides of the object to be processed 3012. Moreover, an inert gas may be used for the transporting gas that is provided from the gas supply means 3029.

The plasma generation means 3025 is composed of the first electrode and second electrodes, and connected to a high frequency power source 3017, an exhausting system, a gas supply means, and the like. In the plasma treatment chamber 3023, the object to be processed 3012 that has finished the predetermined surface treatment is transported to a transport chamber 3024, and the object to be treated 3012 is transported to another treatment chamber from the transport chamber 3024.

Either or both of the first and the second electrodes may be preferably covered with a solid derivative. A metal oxide such as silicon dioxide, aluminum oxide, zirconium dioxide, titanium dioxide, a plastic such as polyethylene terephthalate, polytetrafluoroethylene, a glass, a compound oxide such as barium titanate can be noted as the solid derivative. The shape of the solid derivative may be sheet like or film like, however the thickness is preferably 0.05 mm to 4 mm. This is because the thin solid derivative causes arc discharge due to the dielectric breakdown, in the case of the film is thin, generated when applying voltage since high voltage is required to generate discharge plasma.

Further, a program that can perform plasma treatment is incorporated in the desired area, namely, only in the region in which a resist capable of ashing is arranged or in the periphery thereof in a CPU of the plasma treatment apparatus. According to this, a gas to be supplied can be saved and the manufacturing cost can be reduced.

Figure 17:
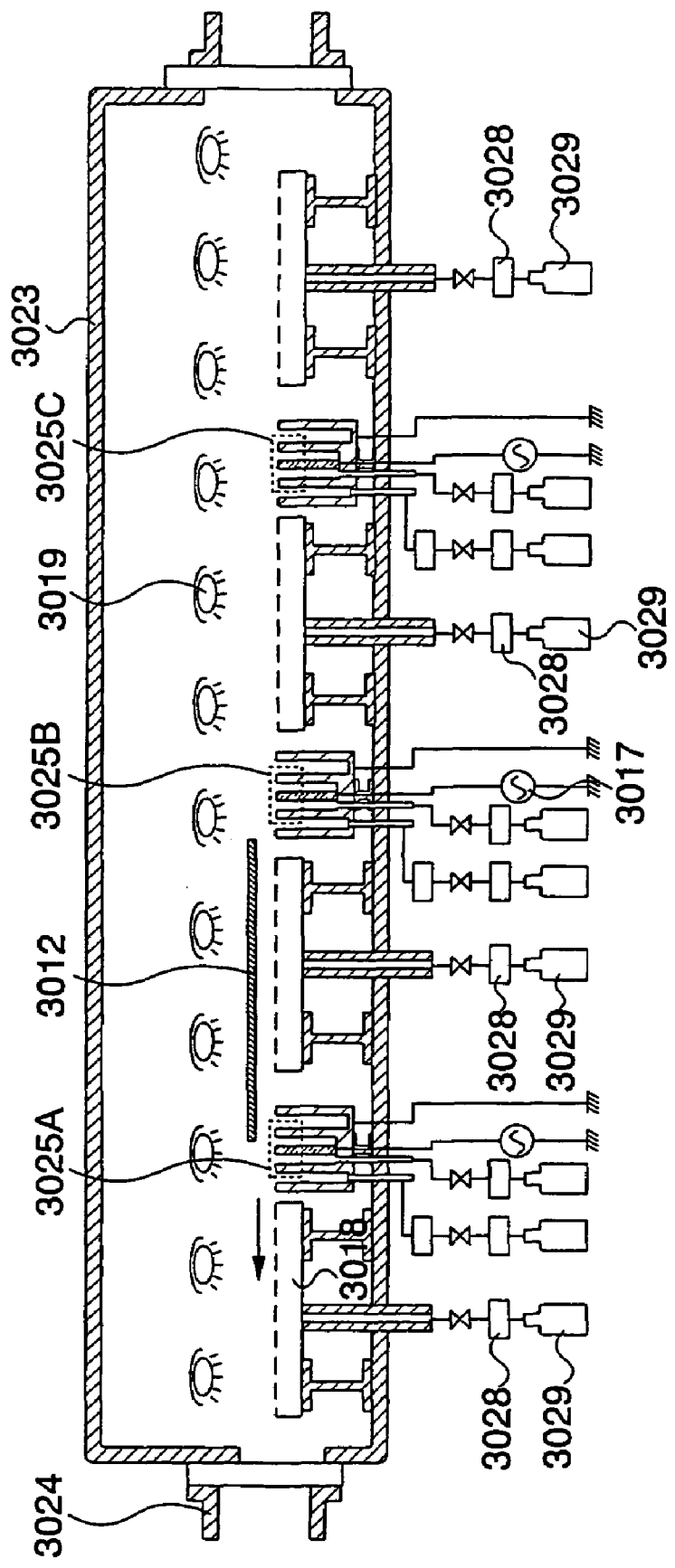
FIG. 17 is a cross sectional view of a plasma processing apparatus.

In addition, unlike in the case of the above described FIGS. 13A and 13B, by placing a plurality of plasma generation means in the direction of movement in sequence, a plurality of surface treatments may be carried out continuously to the object to be processed 3012. For instance, as shown in FIG. 17, by placing a plurality of plasma generation means 3025A to 3025C in order, and by transporting the object to be processed 3012 in the direction of movement, plurality of the surface treatment are carried out continuously. The reason is as follows: because the plasma treatment apparatus of this invention is operated under atmospheric pressure or around atmospheric pressure; therefore, there is no need to provide a treatment chamber separately that carry out each of the surface treatment; and the pollution from the external can be prevented only by providing the airflow control means 3018 The airflow control means 3018 for controlling the gas is used as a transport means of the object to be processed 3012 by fixing the plasma generation means 3025. Accordingly, in the case where the plurality of surface treatment are carried out continuously, the plasma generation means may be placed in the direction of movement in order in the same treatment chamber, and the object to be processed 3012 may be transported by using the airflow control means 3018.

It is an object of the present invention to provide the plasma treatment apparatus and the method for the plasma treatment by which the object to be processed is uniformly heated by being blown with the heated gas; the object to be processed is horizontally floated and moved without condition of contact by the gas, and the plasma treatment is performed efficiently. Moreover, by the airflow control means for discharging the gas in an oblique direction and a vertical direction, the entire surface of the object to be processed (especially, suitable for a substrate having a large size) is moved, and the object to be processed is exposed to blowing and sucking simultaneously in the airflow control means. Accordingly, the floated height of the object to be processed is adjusted, and the level accuracy of the object to be processed is adjusted with the gas flow to adjust the height of the object to be processed accurately. According to the above structure, the control of the distance between the plasma and the object to be processed can be carried out easily. Furthermore, in the present invention, the size of the object to be processed is not limited, and the plasma treatment can be carried out properly and easily by transporting depending on the shape of the surface of the object to be processed.

In addition, according to the present invention having the above structure, a deposition rate of the film by CVD, a rate of etching, and a rate of ashing are improved. Furthermore, plurality times of surface treatment can be carried out continuously by placing the plasma generation means in order in the same treatment chamber; therefore, a manufacturing device is simplified. In the case of forming a film by CVD, the film is preferably made by forming the plasma generation means in a linear shape and by scanning the plasma having a linear shape. Furthermore, in the case of forming a wiring according to the present invention, an apparatus having an inline system or a multi chamber system is preferably used so that the throughput can be improved.

This embodiment can be freely combined with the other described embodiment.

Embodiment 4

The embodiment mode of the present invention is described with reference to FIGS. 11A to 11C. FIG. 11A is a top view of a display panel formed by sealing a substrate in which transistors are formed with a sealing material. FIG. 11B is a cross sectional diagram along a line B-B' in FIG. 11A. FIGS. 11C and 11D are cross sectional diagrams along a line A-A' in FIG. 11A.

In FIGS. 11A to 11C, a pixel portion (display portion) 402; a signal line driver circuit 403 which are provided so as to surround the pixel portion 402, and scanning line driver circuits 404a and 404b are all located on a substrate 401, and a seal material 406 is provided to surround the all. As the seal material 406, a glass material, a metal material (typically, a stainless steel material), a ceramic material, or a plastic material (including a plastic film) may be used.

The seal material 406 may be provided to partially overlap with the signal line driver circuit 403, and the scanning line driver circuits 404a and 404b. A sealing material 407 is provided using the seal material 406, so that a closed space 408 is formed by the substrate 401, the seal material 406, and the sealing material 407. A hygroscopic agent (barium oxide, calcium oxide, or the like) 409 is provided in advance in a concave portion of the sealing material 407, so that it has a function of absorbing moisture, oxygen, and the like to keep the atmosphere clean in an inner portion of the above closed space 408, thereby suppressing the deterioration of a light-emitting element. The concave portion is covered with a covering material 410 with a fine mesh shape. The covering material 410 allows air and moisture to pass therethrough but not the hygroscopic agent 409. Note that the closed space 408 may be preferably filled with a noble gas such as nitrogen or argon, or may be filled with a resin or a liquid if it is inert.

Also, an input terminal portion 411 for transmitting signals to the signal line driver circuit 403 and the scanning line driver circuits 404a and 404b is provided on the substrate 401. Data signals such as video signals are transferred to the input terminal portion 411 through a FPC (flexible printed circuit) 412. With respect to a cross section of the input terminal portion 411, as shown in FIG. 11B, an input wiring 413 formed from a wiring which is formed together with the scanning wiring or the signal wiring is electrically connected with a wiring 415 provided on the FPC 412 side through a resin 417 in which electric conductors 416 are dispersed. Note that a spherical polymer compound plated with gold or silver is preferably used for the electric conductors 416.

In a display panel of FIG. 11D, a transparent counter substrate 421 is provided using the seal material 406, so that a closed space 422 is formed by the substrate 401, the counter substrate 421, and the seal material 406. A color filter 420 and a protective film 423 for protecting the color filter are provided for the counter substrate 421. Light emitted form a light-emitting element arranged in the pixel portion 402 is exteriorly discharged, and a multi color display is carried out in the display panel. The closed space 422 is filled with inert resin or liquid. In the case of carrying out the multicolor display, the electroluminescent layer is set to emit each color of RGB or a pixel provided with the electroluminescent layer that emits white color luminescence is set to arranged in order that the color filter and the color conversion layer can be used.

Then, a panel provided with a memory circuit and a CPU in addition to a pixel portion and a driver circuit for controlling the pixel portion over the surface of the same insulating substrate is explained with reference to FIG. 11E.

FIG. 11E shows the appearance of a panel. The panel has a pixel portion 3000 wherein plural pixels are arranged in matrix over a substrate 3009. A scanning line driver circuit 3001 for controlling the pixel portion 3000, and a signal line driver circuit 3002 are provided at the periphery of the pixel portion 3000. In the pixel portion 3000, an image is displayed according to a signal supplied from the driver circuit. The counter substrate may be provided only over the pixel portion 3000 and the driver circuits 3001 and 3002, or may be provided over the entire surface alternatively. Note that, it is preferable that the CPU 3008 that may generate heat be provided with a heat sink contiguously. Further, the panel also has a VRAM 3003 (video random access memory, a screen display memory only), and decoders 3004 and 3005 at the periphery of the VRAM 3003. In addition, the panel has a RAM (random access memory) 3006, a decoder 3007 at the periphery of the RAM 3006, and the CPU 3008. All elements forming a circuit over the substrate 3009 are formed of a polycrystalline semiconductor (polysilicon) that has higher field-effect mobility and higher ON current than that of an amorphous semiconductor. Therefore, a plurality of circuits can be formed into an integrated circuit over one insulating surface. The structure of the plural pixels in the pixel portion is, but not exclusively, formed by providing SRAM to each of the plural pixels. Thus, VRAM 3003 and RAM 3006 may be omitted.

Here, an example of applying the present invention to the display panel using a light-emitting element is illustrated, however, the present invention may be applied to a display panel using a liquid crystal display element. Further, the present embodiment can be freely combined with above described embodiment modes.

Embodiment 5

Various electric apparatus can be obtained by according to the present invention. The concrete examples are explained with reference to FIGS. 12A to 12C.

Figure 12A:
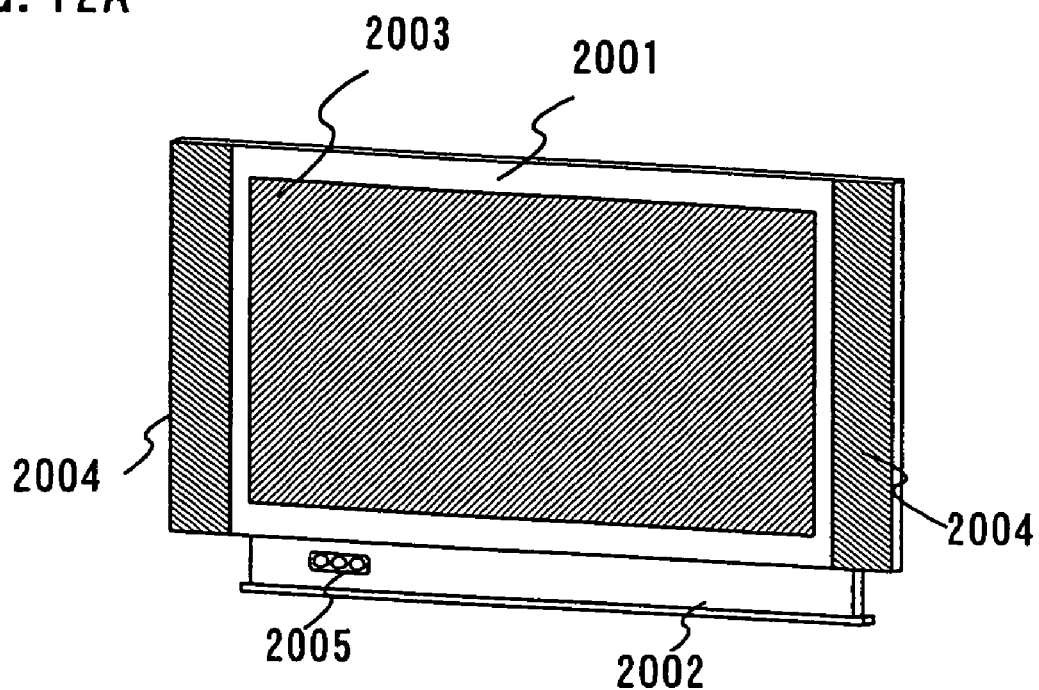
FIGS. 12A to 12C are diagrams showing electric apparatus.

FIG. 12A is a display device, which includes a frame 2001, a support medium 2002, a display portion 2003, a speaker portion 2004, a video input terminal 2005, and the like. The invention can be applied for manufacturing the display portion 2003. In specific, the present invention is adequate for manufacturing a display device having a large screen of form 20 to 80 inches.

Figure 12B:
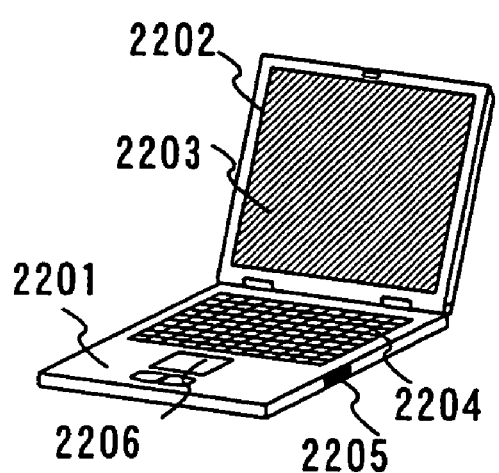

FIG. 12B is a laptop personal computer, which includes a body 2201, a frame 2202, a display portion 2203, a keyboard 2204, an exterior connection port 2205, a pointing mouse 2206 and the like. The invention can be applied for manufacturing the display portion 2203.

Figure 12C:
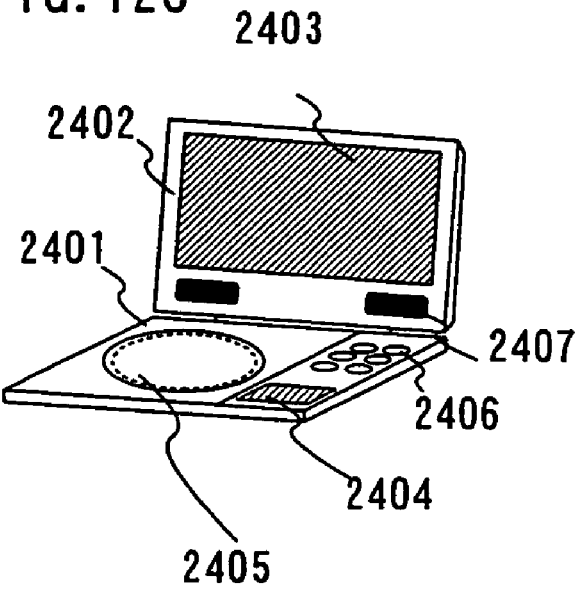

FIG. 12C is a portable image reproduction device provided with a recording medium (specifically, a DVD reproduction device), which includes a main body 2401, a frame 2402, a display portion A 2403, a display portion B 2404, a recording medium (such as a DVD) read-in portion 2405, operation keys 2406, a speaker portion 2407, and the like. The display portion A 2403 mainly displays image information, and the display portion B 2404 mainly displays character information. The invention can be applied for manufacturing the display portions A 2403 and B 2404.

As described above, this invention can be widely applied, and especially the present invention can be applied for manufacturing various kinds of electric apparatus. In addition, the above described embodiment modes and embodiments can be freely combined with each other.

This application is base on Japanese Patent Application serial no. 2003-009106 filed in Japanese Patent Office on Jan. 17, 2003, the contents of which are hereby incorporated by reference.

Although the present invention has been fully described by way of example with reference to the accompanying drawings, it is to be understood that various changed and modification will be apparent to those skilled in the art. Therefore, unless otherwise such changes and modification depart from the scope of the present invention herein after defined, they should be construed as being included therein.

What is claimed is:

1. A method of manufacturing a semiconductor device, comprising the steps of:
   forming a gate electrode over a substrate by discharging a conductive material;
   heating the gate electrode by a lamp or a laser beam;
   planarizing the gate electrode;
   forming a gate insulating layer over the gate electrode; and
   forming a semiconductor layer over the gate insulating layer.

2. A manufacturing method of a semiconductor device according to claim 1, wherein the conductive material is dissolved in a solvent.

3. A manufacturing method of a semiconductor device according to claim 1, wherein the conductive material is dispersed in a solvent.

4. A manufacturing method of a semiconductor device according to claim 1, wherein the conductive material includes silver particles.

5. A manufacturing method of a semiconductor device according to claim 1, wherein the conductive material includes gold particles.

6. A manufacturing method of a semiconductor device according to claim 1, wherein the semiconductor layer includes an amorphous silicon.

7. A manufacturing method of a semiconductor device according to claim 1, wherein the semiconductor layer includes a crystalline silicon.

8. A manufacturing method of a semiconductor device according to claim 1, further comprising planarizing the gate electrode by a surface pressing.

9. A method of manufacturing a semiconductor device, comprising the steps of:
   forming a semiconductor layer over a substrate;
   forming a gate insulating layer over the semiconductor layer;
   forming a gate electrode over the gate insulating layer by discharging a conductive material;
   heating the gate electrode by a lamp or a laser beam; and
   planarizing the gate electrode.

10. A manufacturing method of a semiconductor device according to claim 9, wherein the conductive material is dissolved in a solvent.

11. A manufacturing method of a semiconductor device according to claim 9, wherein the conductive material is dispersed in a solvent.

12. A manufacturing method of a semiconductor device according to claim 9, wherein the conductive material includes silver particles.

13. A manufacturing method of a semiconductor device according to claim 9, wherein the conductive material includes gold particles.

14. A manufacturing method of a semiconductor device according to claim 9, wherein the semiconductor layer includes an amorphous silicon.

15. A manufacturing method of a semiconductor device according to claim 9, wherein the semiconductor layer includes a crystalline silicon.

16. A manufacturing method of a semiconductor device according to claim 9, further comprising planarizing the gate electrode by a surface pressing.

17. A method of manufacturing a semiconductor device, comprising the steps of:
   forming a gate electrode over a substrate by discharging a conductive material;
   heating the gate electrode by a lamp or a laser beam;
   planarizing the gate electrode;
   forming a gate insulating layer over the gate electrode; and
   forming a semiconductor layer over the gate insulating layer;
   wherein the conductive material is discharged under reduced pressure.

18. A manufacturing method of a semiconductor device according to claim 17, wherein the conductive material is dissolved in a solvent.

19. A manufacturing method of a semiconductor device according to claim 17, wherein the conductive material is dispersed in a solvent.

20. A manufacturing method of a semiconductor device according to claim 17, wherein the conductive material includes silver particles.

21. A manufacturing method of a semiconductor device according to claim 17, wherein the conductive material includes gold particles.

22. A manufacturing method of a semiconductor device according to claim 17, wherein the semiconductor layer includes an amorphous silicon.

23. A manufacturing method of a semiconductor device according to claim 17, wherein the semiconductor layer includes a crystalline silicon.

24. A manufacturing method of a semiconductor device according to claim 17, wherein the reduced pressure is $1 \times 10^2$ to $2 \times 10^4$ Pa.

25. A manufacturing method of a semiconductor device according to claim 17, further comprising planarizing the gate electrode by a surface pressing.

26. A method of manufacturing a semiconductor device, comprising the steps of:
   forming a semiconductor layer over a substrate;
   forming a gate insulating layer over the semiconductor layer;
   forming a gate electrode over the gate insulating layer by discharging a conductive material;
   heating the gate electrode by a lamp or a laser beam; and
   planarizing the gate electrode;
   wherein the conductive material is discharged under reduced pressure.

27. A manufacturing method of a semiconductor device according to claim 26, wherein the conductive material is dissolved in a solvent.

28. A manufacturing method of a semiconductor device according to claim 26, wherein the conductive material is dispersed in a solvent.

29. A manufacturing method of a semiconductor device according to claim 26, wherein the conductive material includes silver particles.

30. A manufacturing method of a semiconductor device according to claim 26, wherein the conductive material includes gold particles.

31. A manufacturing method of a semiconductor device according to claim 26, wherein the semiconductor layer includes an amorphous silicon.

32. A manufacturing method of a semiconductor device according to claim 26, wherein the semiconductor layer includes a crystalline silicon.

33. A manufacturing method of a semiconductor device according to claim 26, wherein the reduced pressure is $1\times10^2$ to $2\times10^4$ Pa.

34. A manufacturing method of a semiconductor device according to claim 26, further comprising planarizing the gate electrode by a surface pressing.

* * * * *

UNITED STATES PATENT AND TRADEMARK OFFICE
CERTIFICATE OF CORRECTION

PATENT NO. : 7,648,897 B2  Page 1 of 1
APPLICATION NO. : 11/650693
DATED : January 19, 2010
INVENTOR(S) : Yamazaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 359 days.

Signed and Sealed this

Twenty-third Day of November, 2010

David J. Kappos
*Director of the United States Patent and Trademark Office*